(12) United States Patent
Oohira et al.

(10) Patent No.: US 8,728,621 B2
(45) Date of Patent: May 20, 2014

(54) HARD MULTILAYER FILM FORMED BODY AND METHOD FOR MANUFACTURING SAME

(75) Inventors: Kouya Oohira, Mie (JP); Naoko Ito, Mie (JP); Yoji Sato, Mie (JP); Hideyuki Tsutsui, Mie (JP)

(73) Assignee: NTN Corporation, Osaka (JP)

(\*) Notice: Subject to any disclaimer, the term of this patent is extended or adjusted under 35 U.S.C. 154(b) by 208 days.

(21) Appl. No.: 12/998,426

(22) PCT Filed: Oct. 29, 2009

(86) PCT No.: PCT/JP2009/068555
§ 371 (c)(1),
(2), (4) Date: Apr. 18, 2011

(87) PCT Pub. No.: WO2010/050542
PCT Pub. Date: May 6, 2010

(65) Prior Publication Data
US 2011/0195265 A1     Aug. 11, 2011

(30) Foreign Application Priority Data

Oct. 29, 2008 (JP) ................................. 2008-278852
Sep. 25, 2009 (JP) ................................. 2009-220048
Sep. 25, 2009 (JP) ................................. 2009-220074
Sep. 25, 2009 (JP) ................................. 2009-220088

(51) Int. Cl.
C23C 14/06 (2006.01)
B23B 27/14 (2006.01)

(52) U.S. Cl.
USPC ............... 428/408; 204/192.12; 204/192.15; 428/336

(58) Field of Classification Search
USPC ............ 204/192.12, 192.15; 428/408, 336
See application file for complete search history.

(56) References Cited

U.S. PATENT DOCUMENTS 4,842,937 A \* 6/1989 Meyer et al. .................. 428/408
6,599,400 B2 \* 7/2003 Strondl et al. ........... 204/192.15
(Continued)

FOREIGN PATENT DOCUMENTS

CN        1927581 A       3/2007
DE   602005003762 T       5/2006
(Continued)

OTHER PUBLICATIONS

PCT Search Report dated Nov. 24, 2009.
(Continued)

Primary Examiner — Archene Turner
(74) Attorney, Agent, or Firm — Hedman & Costigan, P.C.; James V. Costigan; Kathleen A. Costigan

(57) ABSTRACT

The present invention provides a hard multilayer film formed body which has an intermediate layer excellent in its adhesion to a base material and a DLC film which is a surface layer excellent in its wear resistance, prevents peeling from occurring between the DLC film and the intermediate layer, and is excellent in its wear resistance and a method for producing the same. A hard multilayer film formed body 1 consists of a multilayer film formed on a surface of a base material 2 consisting of a cemented carbide material or a ferrous material. The multilayer film has (1) a film, composed mainly of DLC, which is formed as a surface layer 5 of the multilayer film; (2) an intermediate layer 3, composed mainly of a metallic material, which is formed between the surface layer 5 and the base material 2; and (3) a stress relaxation layer 4, composed mainly of carbon, which is formed between the intermediate layer 3 and the surface layer 5. The stress relaxation layer 4 is a graded layer whose hardness increases continuously or stepwise from a side of the intermediate layer 3 toward a side of the surface layer 5.

8 Claims, 9 Drawing Sheets

(56) References Cited

U.S. PATENT DOCUMENTS

| | | | |
|---|---|---|---|
| 6,716,540 B2* | 4/2004 | Kohara et al. | 428/408 |
| 6,726,993 B2* | 4/2004 | Teer et al. | 428/408 |
| 7,323,219 B2* | 1/2008 | Teer | 204/192.15 |
| 7,498,083 B2* | 3/2009 | Yamamoto et al. | 428/408 |
| 7,887,919 B2* | 2/2011 | Yamamoto et al. | 428/408 |
| 7,955,691 B2* | 6/2011 | Moronuki et al. | 428/408 |
| 2002/0136895 A1 | 9/2002 | Kohara | |
| 2006/0105172 A1 | 5/2006 | Yamamoto et al. | |
| 2007/0054125 A1 | 3/2007 | Akari et al. | |

FOREIGN PATENT DOCUMENTS

| | | |
|---|---|---|
| DK | 1657323 T | 5/2006 |
| EP | 1 657 323 A1 | 5/2006 |
| EP | 1 760 172 A2 | 3/2007 |
| JP | 2000-119843 A | 4/2000 |
| JP | 2002-256415 A | 9/2002 |
| JP | 2003-171758 A | 6/2003 |
| JP | 2006-138404 A | 6/2006 |
| JP | 2007-046144 A | 2/2007 |
| JP | 2007-070667 A | 3/2007 |
| JP | 2008-081522 A | 4/2008 |
| JP | 2009-052067 A | 3/2009 |
| KR | 10-2007-0026251 A | 3/2007 |
| WO | 03/064720 * | 8/2003 |

OTHER PUBLICATIONS

Hirotaka Ito et al, Mechanical Property Evaluation and Structural Analysis of DLC Films Prepared by UBMS, Proceedings of the Surface Finishing Society of Japan, vol. 118, pp. 110-111, Aug. 2008 (with English Abstract).

Koichiro Akari et al., High Performance Me-DLC for Automobile Parts, Transactions of the Japan Society of Mechanical Engineers M&M 2003 Spring Symposium, pp. 151-154, Mar. 2003 (with English Abstract).

Morimasa Nakamura et al.,Effects of Deposition Conditions on Residual Stress in DLC Films Prepared by Sputtering, Journal of the Society of Materials Science, Japan, vol. 57, No. 5, pp. 488-494 May 2008 (with English Abstract).

Koichiro Akari et al., DLC Coating Film Properties in Unbalanced Magnetron Sputtering, Kobe Steel Engineering Reports, vol. 50, No. 2, Sep. 2000 pp. 58-61 (with English Abstract).

* cited by examiner (a)     (b)

HARD MULTILAYER FILM FORMED BODY AND METHOD FOR MANUFACTURING SAME

TECHNICAL FIELD

The present invention relates to hard multilayer film formed body whose surface layer consists of a diamond-like carbon film and which shows a favorable adhesion to a ferrous base material composing parts of a car, various molding dies and the like and a carbide base material composing mechanical parts and the like and has an excellent wear resistance and a method for producing the same.

BACKGROUND ART

The hard carbon film is a rigid film called diamond-like carbon (hereinafter referred to as DLC. A film/layer composed mainly of DLC is called DLC film/layer.). In addition the hard carbon film has various names such as a hard non-crystalline carbon, amorphous carbon, hard amorphous carbon, i-carbon, and diamond-like carbon, but these terms are not clearly distinguished from one another.

As the essential quality of the DLC for which the above-described terms are used, the DLC has a structure intermediate between diamond and graphite. The DLC has a high hardness comparable to diamond and is excellent in its wear resistance, lubricity, thermal conductivity, and chemical stability. Therefore the DLC is utilized as a protection film of dies, tools, wear-resistant machine parts, abrasive materials, sliding members, and magnetic optical component parts. As methods for forming the DLC film, a physical vapor deposition (hereinafter referred to as PVD) method such as a sputtering method and an ion-plating method and a chemical vapor deposition (hereinafter referred to as CVD) method are adopted. For example, a DLC film obtained by a filtered arc method used in an arc ion-plating is known (see patent document 1).

Normally the DLC film generates a very large internal stress when it is formed and has a high hardness and Young's modulus but a very small deformability. Thus the DLC film has defects that it has a low adhesion to a base material and is liable to peel therefrom. As means for improving the adhesion to the base material, two methods are listed: (1) a method of controlling the stress of the film and (2) a method of forming an intermediate layer between the base material and a carbon film. But these arts have problems shown below. The actual situation is that improvement for these arts is desired. In the above-described methods, from the standpoint of joining the base material and DLC film with each other with an intermediate layer, serving as a gluing layer, which has a property intermediate between the tissues and mechanical properties of the base material and DLC film. Thus the intermediate layer containing a hard and brittle material is adopted. But when a thick film having a thickness of several micrometers is formed and when a hard film, containing a large amount of a diamond component, whose hardness exceeds 40 GPa is formed, there arises a problem of defective adhesion owing to a very large stress in the DLC film formed by the PVD method or the CVD method.

To solve this problem, a DLC hard multilayer film formed body in which the uppermost surface layer consists of the DLC film showing adhesion not less than 50N in a scratch test is known (see patent document 2). This art relates to the DLC hard multilayer film formed body having a two-layer structure composed of the uppermost surface layer consisting of the DLC film and the intermediate layer, disposed between the base material and the uppermost surface layer, which consists of the amorphous layer containing carbon and not less than one kind of metallic element selected from among W, Ta, Mo, and Nb. Description is made in the specification of the patent document 2 that in the DLC hard multilayer film formed body having the above-described film structure, a preferable adhesion of the DLC film to the base material consisting of cemented carbide such as WC—Co. But this art also has a problem to be solved, as described below.

In the above-described art, the cemented carbide such as the WC—Co is fundamentally used as the base material. Therefore in the case where WC—Co-based cemented carbide and an insulation material such as Si, $Al_2O_3$ are used as the base material, the intermediate layer is capable of securing a preferable adhesion to the base material. But when a ferrous material such as high-speed tool steel is used as the base material, the intermediate layer and the base material are not always compatible with each other. Thus this art has a problem that the adhesion between the intermediate layer and the base material is poor and that the DLC film is liable to peel from the base material. In addition the condition for forming the DLC film excellent it its wear resistance as the uppermost surface layer of the hard multilayer film formed body is not optimized and thus there is room for improvement.

As an art for improving the adhesion, the art of coating the base material consisting of a ferrous material having a low hardness with the DLC film with a high adhesion is known. According to the description, even though the DLC film is comparatively thickly formed, this art allows the DLC film to display excellent adhesion to the base material (see patent document 3). This art relates to the hard multilayer film formed body including the uppermost surface layer composed mainly of the DLC, the intermediate layer, and the base material consisting of the ferrous material. The intermediate layer has a four-layer structure.

(1) The first layer consisting of the metallic layer of Cr and/or Al (2) The second layer consisting of the mixed layer of the metal of Cr and/or Al and not less than one kind of the metal selected from among the group of W, Ta, Mo, and Nb (3) The third layer consisting of not less than one kind of the metal selected from among the group of W, Ta, Mo, and Nb (4) The fourth layer consisting of the amorphous layer containing carbon and not less than one kind of the metal selected from among the group of W, Ta, Mo, and Nb In the specification of the patent document 3, description is further made as follows: It is preferable that the second layer has the graded layer in which the content of the Cr and/or the Al stepwise or continuously decreases toward the uppermost surface layer. It is preferable that the fourth layer has the gradient composition in which the content of not less than one kind of the metal selected from among the group of W, Ta, Mo, and Nb stepwise or continuously decreases toward the uppermost surface layer. Description is further made that it is possible to use a compound containing WC as its main component instead of not less than one kind of the metal selected from among the group of W, Ta, Mo, and Nb which are the components of the second, third, and fourth layers.

To form the DLC film excellent in its adhesion, a method for forming the hard multilayer film having the two-layer structure by utilizing unbalanced magnetron sputtering (hereinafter referred to as UBMS) has been proposed (see patent document 4).

PRIOR ART DOCUMENT

Patent Document

Patent document 1: Japanese Patent Application Laid-Open No. 2007-046144
Patent document 2: Japanese Patent Application Laid-Open No. 2000-119843
Patent document 3: Japanese Patent Application Laid-Open No. 2003-171758
Patent document 3: Japanese Patent Application Laid-Open No. 2002-256415

SUMMARY OF THE INVENTION

Problem to be Solved by the Invention

But in the case of the filtered arc method disclosed in the patent document 1, the electromagnetic spatial filer is used. Thus the apparatus is very expensive, and it is necessary to make the apparatus large in maintaining a sufficient removal effect. Further because ionized carbon atoms have a high degree of linearity, a film-forming region is limited. Thus the DLC film is unsuitable for treating a large number of large and small parts. The art disclosed in the patent document 1 focuses on obtaining the DLC film excellent in its surface smoothness, but the wear resistance of the obtained DLC film is not described in the specification thereof.

Even though the arts of the patent documents 2 through 4 are used, there is a possibility that peeling occurs between the DLC film and the intermediate layer when the structure of the DLC film which is the uppermost surface layer is not optimized. Further the patent documents 2 through 4 do not provide data, (for example, hardness and the like of DLC film) relating to the wear resistance, which supports the condition for forming the DLC film preferable in its adhesion and excellent in its wear resistance. In the patent documents 2 through 4, there is no disclosure on methods for forming the DLC film which has a sufficient wear resistance and does not peel or crack when the DLC film is formed on a sliding surface of a sliding member. Furthermore in dependence on a film-forming condition, there is a case where a large number of droplets or adhered particles are present on the surface on which the DLC film is formed. Thus the DLC film is unsuitable in using it for a die and a mechanical part such as the sliding member. In addition methods for forming the thick DLC film are not described in the patent documents 2 through 4.

The present invention has been made to cope with the above-described problems. It is an object of the present invention to provide a hard multilayer film formed body which has an intermediate layer excellent in its adhesion to a base material and a DLC film which is a surface layer excellent in its wear resistance, prevents peeling from occurring between the DLC film and the intermediate layer, and is excellent in its wear resistance and a method for producing the same.

Means for Solving the Problem

The hard multilayer film formed body of the present invention consists of a multilayer film formed on a surface of a base material, wherein the multilayer film has (1) a film, composed mainly of DLC, which is formed as a surface layer of the multilayer film, (2) an intermediate layer, composed mainly of a metallic material, which is formed between the surface layer and the base material, and (3) a stress relaxation layer, composed mainly of carbon (hereinafter referred to as C), which is formed between the intermediate layer and the surface layer; and the stress relaxation layer is a graded layer whose hardness increases continuously or stepwise from a side of the intermediate layer toward a side of the surface layer.

In the surface layer, only graphite target is used as a carbon supply source; and the surface layer is formed by using UBMS method.

The intermediate layer consists of a plurality of layers having different compositions; and a first layer adjacent to the stress relaxation layer at one side thereof is composed mainly of a metal which is a main component of a second layer adjacent to the other side of the first layer and C.

The intermediate layer has a two-layer structure consisting of a first layer, adjacent to the base material, which is composed mainly of tungsten (hereinafter referred to as W); and a second layer, adjacent to the first layer at one side thereof and adjacent to the stress relaxation layer at the other side thereof, which is composed mainly of C and W. The intermediate layer has a three-layer structure consisting of a first layer, adjacent to the base material, which is composed mainly of chrome (hereinafter referred to as Cr); a second layer, adjacent to the first layer, which is composed mainly of W; and a third layer, adjacent to the second layer at one side thereof and adjacent to the stress relaxation layer at the other side thereof, which is composed mainly of C and W.

The total thickness of the multilayer is 0.5 to 3.0 µm. The hard multilayer film formed body has adhesion to such an extent that peeling does not occur on a periphery of an impression generated when a diamond indenter is stricken thereinto at a load of 150 kg by a Rockwell hardness tester.

The base material consists of a cemented carbide material or a ferrous material.

The method of the present invention for producing the hard multilayer film formed body has an intermediate layer-forming step of forming the intermediate layer on the base material, a stress relaxation layer-forming step of forming the stress relaxation layer on the intermediate layer, and a surface layer-forming step of forming the surface layer on the stress relaxation layer, wherein the surface layer-forming step is a step at which an UBMS method is used to form a film composed mainly of DLC by using a graphite target as a carbon supply source; and the stress relaxation layer-forming step is a step at which the UBMS method is used to form the stress relaxation layer by using the graphite target and continuously or stepwise raising a bias voltage.

At the surface layer-forming step, as a carbon supply source, only the graphite target is used, and hydrocarbon gas is not used.

At the stress relaxation layer-forming step, a step width in raising the bias voltage stepwise is set to not more than 50V. At the surface layer-forming step, the film is formed by applying the bias voltage not less than 250V to the base material.

The bias voltage is applied to the base material such that the electric potential of the bias voltage is minus with respect to the ground potential. Thus the bias voltage of 250V means that the bias voltage applied to the base material is −250V with respect to the ground potential.

At the intermediate layer-forming step, the intermediate layer is formed by using a metallic material containing at least chrome or tungsten.

In the UBMS method, argon (hereinafter referred to as Ar) gas is used as a sputtering gas.

Effect of the Invention

The hard multilayer film formed body of the present invention consists of the multilayer film formed on the surface of the base material and has the intermediate layer excellent in its adhesion to the base material, the DLC film which is the surface layer, and the graded layer, disposed between the intermediate layer and the surface layer, which is composed mainly of C and increases continuously or stepwise in its hardness from the side of the intermediate layer toward the side of the surface layer. Therefore the DLC film which is the surface layer is excellent in its wear resistance, and further peeling does not occur between the stress relaxation layer (graded layer) disposed at the lowermost portion of the DLC film and the intermediate layer. Furthermore because the surface layer is formed by using only the graphite target as the carbon supply source, the surface of the hard multilayer film formed body consists of the DLC film containing a small amount of hydrogen. Thus the hard multilayer film formed body is excellent in its wear resistance.

The intermediate layer consists of a plurality of layers having different compositions, and one layer whose one side is adjacent to the stress relaxation layer contains the metal which is main components of the other layer adjacent to the other side of the one layer and C. Thereby it is possible to improve the adhesion between the intermediate layer and the stress relaxation layer.

The hard multilayer film formed body has an excellent adhesion to such an extent that peeling does not occur on the periphery of the impression which is generated when the diamond indenter is stricken thereto at a load of 150 kg by a Rockwell hardness tester.

The method for producing the hard multilayer film formed body has the intermediate layer-forming step, the stress relaxation layer-forming step, and the surface layer-forming step. The surface layer-forming step is the step at which the UBMS method is used to form the film composed mainly of the DLC by using the graphite target as the carbon supply source. The stress relaxation layer-forming step is the step at which the UBMS method is used to form the stress relaxation layer by using the graphite target and by continuously or stepwise raising the bias voltage. Therefore it is possible to form the DLC film excellent in its wear resistance on the surface of the hard multilayer film formed body and easily produce the hard multilayer film formed body excellent in its adhesion between the intermediate layer and the stress relaxation layer (graded layer) disposed at the lowermost portion of the DLC film. At the surface layer-forming step, as the carbon supply source, only the graphite target is used and the hydrocarbon gas is not used. Therefore it is possible to form the DLC film, excellent in its wear resistance, which contains a small amount of hydrogen on the surface of the hard multilayer film formed body.

At the stress relaxation layer-forming step, the step width in raising the bias voltage stepwise is set to not more than 50V. Thereby it is possible to change the density and hardness of the stress relaxation layer (graded layer) finely and stepwise and improve the adhesion thereof.

The DLC film is formed by finally applying the bias voltage of not less than 250V to the base material. Thus an assist effect of ions of a noble gas is enhanced and an energy to be generated by the collision between the base material and the ions of the noble gas increases. Thereby it is possible to form the DLC film dense, very hard, and excellent in its wear resistance

BEST MODE FOR CARRYING OUT THE INVENTION

Investigations have been energetically made to obtain a hard multilayer film formed body excellent in its adhesion and wear resistance. As a result, it has been found that by selecting an intermediate layer excellent in its adhesion to a base material and selecting a film-forming condition for imparting an excellent wear resistance to a DLC film which is a surface layer and particularly by forming a stress relaxation layer (graded layer) in which the adhesion and hardness of DLC is continuously or stepwise changed on a lowermost portion of a DLC layer by continuously or stepwise changing a bias voltage to be applied to the base material when the DLC film is formed, the adhesion between an uppermost portion of the intermediate layer and a lowermost portion of the DLC layer is improved and thereby peeling can be prevented. The present invention has been made based on such knowledge.

Figure 1:
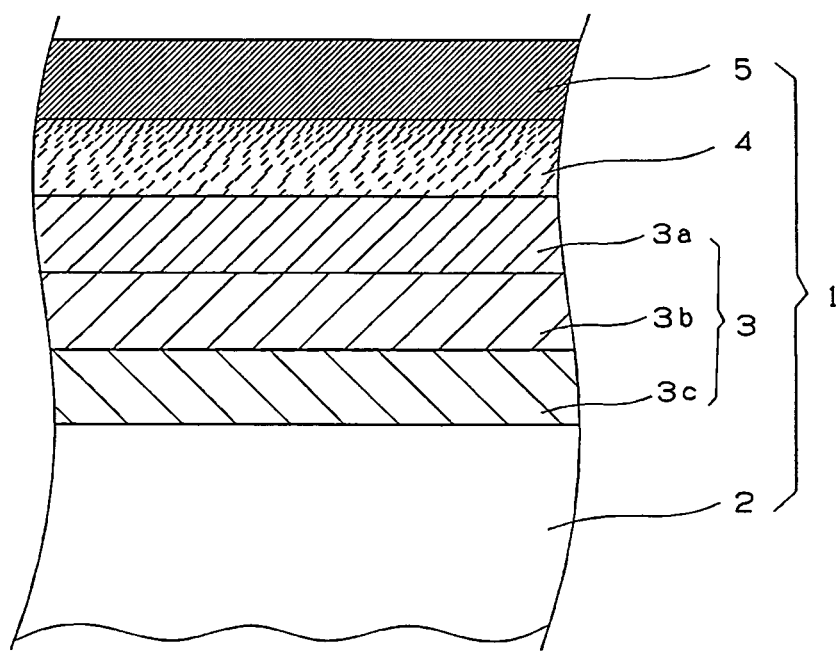
FIG. 1 is a sectional view showing the structure of a hard multilayer film formed body of the present invention.

The hard multilayer film formed body of the present invention is described below with reference to the drawings. FIG. 1 is a sectional view showing the structure of the hard multilayer film formed body of the present invention. As shown in FIG. 1, a hard multilayer film formed body 1 of the present invention is composed of a multilayer film formed on a surface of a base material 2. The multilayer film includes (1) a film, composed mainly of DLC, which is formed as a surface layer 5, (2) an intermediate layer 3, composed mainly of a metallic material, which is formed between the surface layer 5 and the base material 2, and a stress relaxation layer 4 formed between the intermediate layer 3 and the surface layer 5.

The material of the base material 2 is not limited to a specific one, but a cemented carbide material or a ferrous material can be used as the material thereof. As the cemented carbide material, in addition to a WC—Co-alloy most excellent in its mechanical property, it is possible to list a WC—TiC—Co alloy, a WC—TaC—Co alloy, a WC—TiC—TaC—Co alloy improved in oxidation resistance thereof as a cutting tool. As the ferrous material, it is possible to list carbon tool steel, high-speed tool steel, alloy tool steel, stainless steel, bearing steel, and cutting steel. In the present invention, even in a case where an inexpensive ferrous material is used as the base material, a hard film can be formed on the surface thereof.

In using the ferrous material as the base material 2, to enhance the adhesion between the base material 2 and the intermediate layer 3, it is preferable to subject the surface of the base material 2 on which the intermediate layer 3 is to be formed to nitriding treatment before the intermediate layer 3 is formed. As the nitriding treatment, it is preferable to subject the surface of the base material 2 to plasma nitriding treatment to prevent an oxide layer which inhibits adhesion from being formed. It is preferable to set the Vickers hardness of the base material 2 having a nitride layer formed on the surface thereof to not less than Hv1000 to improve the adhesion between the base material 2 and the intermediate layer 3. In improving the surface smoothness of the hard multilayer film formed body, it is preferable to use the base material 2 having a mirror finish.

The intermediate layer 3 has a structure consisting of a plurality of layers having different compositions. In FIG. 1, a three-layer structure consisting of layers 3*a* through 3*c* is exemplified. The intermediate layer is composed mainly of a metallic material. For example, the layer 3*c* composed mainly of Cr is formed on the surface of the base material. The layer 3*b* composed mainly of W is formed on the layer 3*c*. The layer 3*a* composed mainly of the W and C is formed on the layer 3*b*. Although the three-layer structure is shown in FIG. 1, the intermediate layer 3 may be composed of one layer, two layers (see FIG. 7) or not less than four layers if necessary.

By composing the layer 3*a* adjacent to the stress relaxation layer 4 of the carbon and a metal which is the main component of the layer 3*b* to which the other side of the layer 3*a* is adjacent, it is possible to improve the adhesion between the intermediate layer 3 and the stress relaxation layer 4. For example, when the layer 3*a* is composed mainly of the W and the C, by decreasing the content of the W of the layer 3*a* and increasing the content of the C from the side of the intermediate layer 3*b* composed mainly of the W toward the side of the stress relaxation layer 4 composed mainly of the C, it is possible to improve the adhesion between the intermediate layer 3 and the stress relaxation layer 4.

The stress relaxation layer 4 is a graded layer which is composed mainly of the C and has a hardness increasing continuously or stepwise from the side of the intermediate layer 3 toward the side of the surface layer 5. More specifically the stress relaxation layer 4 is a DLC graded layer, the film of which is obtained by using a graphite target and continuously or stepwise increasing a bias voltage to be applied to the base material 2 in a UBMS method. The reason the hardness of the stress relaxation layer 4 increases continuously or stepwise is because the structure ratio between a graphite structure ($SP^2$) and a diamond structure ($SP^3$) offsets to the latter owing to the rise of the bias voltage.

The surface layer 5 consists of a film composed mainly of the DLC formed by the extension of the stress relaxation layer 4. By decreasing the content of hydrogen in the structure of the surface layer 5, the wear resistance thereof can be improved. To form the DLC film, for example, the UBMS method is used to prevent the hydrogen and a compound containing the hydrogen from being mixed with a raw material to be used for sputtering treatment and with a sputtering gas.

Regarding the method of forming the film of the stress relaxation layer 4 and the surface layer 5, the case in which the UBMS method is used has been exemplified. But it is possible to adopt known film-forming methods, provided that they are capable of changing the hardness of the stress relaxation layer and that of the surface layer 5 continuously or stepwise.

In the hard multilayer film formed body 1, it is preferable to set the total of the film thickness of the multilayer consisting of the intermediate layer 3, the stress relaxation layer 4, and the surface layer 5 to 0.5 to 3.0 µm. When the total of the film thickness of the multilayer is less than 0.5 µm, the hard multilayer film formed body is inferior in its wear resistance and mechanical strength. When the total of the film thickness thereof exceeds 3.0 µm, peeling is liable to occur, which is unpreferable.

Figure 3:
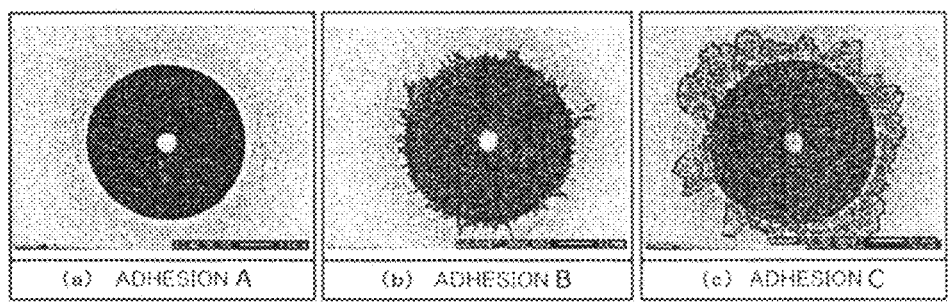
FIG. 3 shows a standard for evaluating adhesion.

It is preferable that the hard multilayer film formed body 1 has adhesion to such an extent that peeling does not occur on the periphery of an impression which is generated when a diamond indenter is stricken thereinto at a load of 150 kg by a Rockwell hardness tester. The expression "peeling does not occur on the periphery of the impression" means a state as shown in FIG. 3(*a*).

The method of the present invention for producing the hard multilayer film formed body includes the step of (1) an intermediate layer-forming step of forming the intermediate layer 3 on the base material 2, (2) a stress relaxation layer-forming step of forming the stress relaxation layer 4 on the intermediate layer 3, and (3) a surface layer-forming step of forming the surface layer 5 on the stress relaxation layer 4.

(1) The intermediate layer-forming step is the step of forming the intermediate layer composed mainly of the metallic material on the base material. When the cemented carbide material or the ferrous material is used as the base material 2 to increase the adhesion of the intermediate layer to the base material 2, it is favorable that the intermediate layer contains not less than one metal selected from among Cr, Al, W, Ta, Mo, Nb, Si, and Ti compatible with the base material 2. The Cr and the W are more favorable. Although the film-forming method is not restricted to a specific one, it is preferable to adopt the UBMS method because the UBMS method allows the intermediate layer 3, the stress relaxation layer 4, and the surface layer 5 to be formed continuously by sequentially replacing targets. In forming the intermediate layer having a graded composition (two kinds) in the UBMS method, two targets are used to adjust a sputtering power to be applied to each of the two targets. Thereby it is possible to tilt the composition ratio.

(2) The stress relaxation layer-forming step is the step at which the UBMS method is used to form the stress relaxation layer (graded layer) 4 by using the graphite target and by continuously or stepwise raising the bias voltage to be applied to the base material. At this step, it is preferable to set a step width to not more than 50V (for example, 25V, 50V) when the bias voltage is changed stepwise. By setting step width to not more than 50V, it is possible to change the density and hardness of the stress relaxation layer 4 finely and stepwise and thus improve the adhesion thereof. When the step width exceeds 50V, the adhesion of the stress relaxation layer 4 is inferior and thus there is a fear that peeling occurs in the stress relaxation layer 4.

Figure 6:
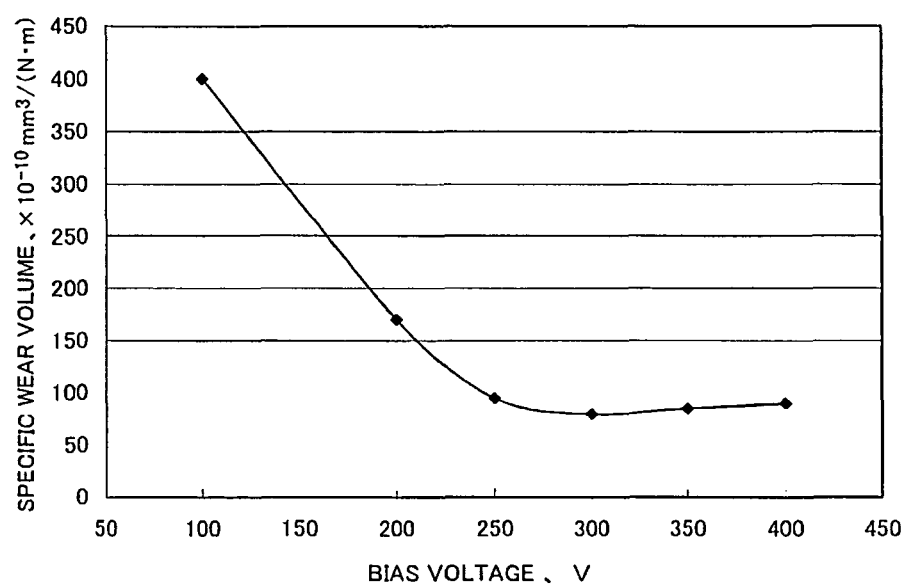
FIG. 6 shows the relationship between a bias voltage and a specific wear volume of a surface.

(3) The surface layer-forming step is the step at which the UBMS method is used to form a film composed mainly of the DLC by using a graphite target which is a solid target as a carbon supply source. As the sputtering gas, it is possible to use noble gases such as He, Ar, and Xe. A noble gas component may be used singly or by mixing not less than two kinds thereof with each other. At this step, it is preferable to form the film by applying the bias voltage of not less than 250V to the base material. By setting the bias voltage to not less than 250V, an assist effect of ions of the noble gas is enhanced and an energy to be generated by the collision between the base material and the ions of the noble gas increases. Thereby it is possible to form the DLC film dense, very hard, and excellent in its wear resistance (see table 2 and FIG. 6 shown later). By not using a hydrocarbon gas such as methane gas serving as a hydrogen supply source as the sputtering gas, the wear resistance of the DLC film can be improved.

Figure 4:
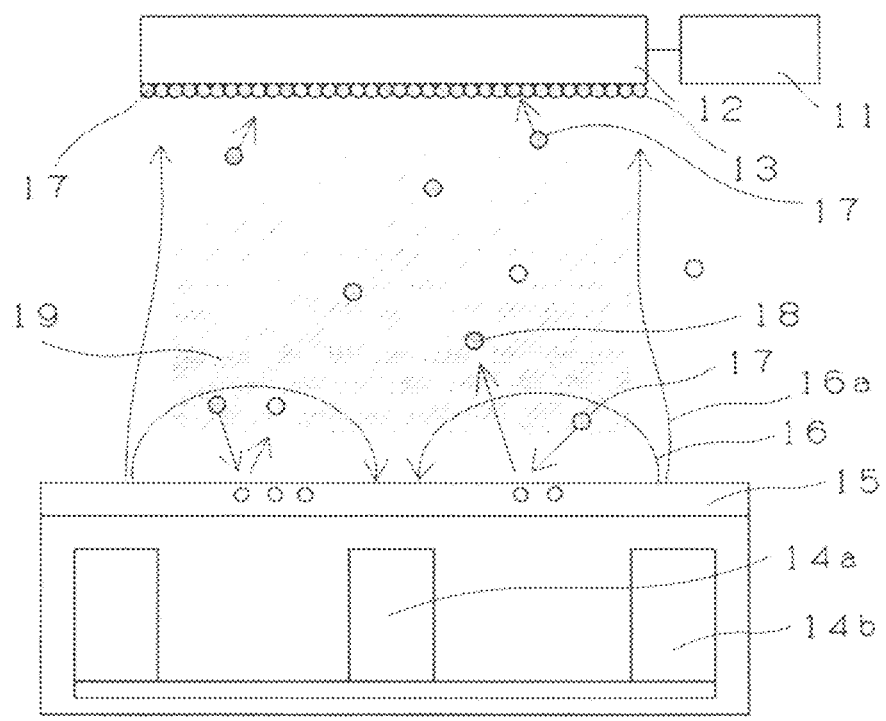
FIG. 4 is a schematic view showing the film-forming principle of a UBMS method.

The film formation principle of the UBMS method in which a UBMS apparatus is used is described below by using a schematic view shown in FIG. 4. As shown in FIG. 4, an inner magnet 14*a* and an outer magnet 14*b* are disposed such that the magnetic property at a central portion of a round target 15 and the magnetic property at a peripheral portion thereof are different from each other. With a high-density plasma 19 being generated in the neighborhood of the target 15, a part 16a of a magnetic field line 16 generated by the magnets 14a, 14b reaches the neighborhood of a base material 12 connected to a bias supply 11. An effect of diffusing Ar plasma generated along the magnetic field line 16a at a sputtering time to the neighborhood of the base material 12 is obtained. The UBMS method allows a dense film (layer) to be formed owing to an ion assist effect that Ar ions 17 and electrons allow a larger number of ionized targets 18 to reach a base material 12 than in ordinary sputtering along the magnetic field line 16a which reaches the neighborhood of the base material 12. In each of the intermediate layer-forming step, the stress relaxation layer-forming step, and the surface layer-forming step, a target 15 corresponding thereto is used.

Examples and comparative examples are shown below. The base material, the UBMS apparatus, and the sputtering gas used and the multilayer-forming condition set in the examples and the comparative examples are as shown below:

(1) Base material: mirrored surface (Ra=about 0.005 μm), 30 mm square, thickness: 5 mm, SUS440C (2) UBMS apparatus: UBMS 202/AIP composite apparatus produced by Kobe Steel, Ltd (3) Sputtering gas: Ar gas (4) Intermediate layer-forming condition Cr layer: Vacuumed up to $5\times10^{-3}$ Pa. The base material was baked at a predetermined temperature by a heater. After the surface of the base material was etched with Ar plasma, a Cr layer was formed by the UBMS method.

W layer: Vacuumed up to $5\times10^{-3}$ Pa. The base material was baked at a predetermined temperature by a heater. After the surface of the base material was etched with Ar plasma, a W layer was formed by the UBMS method.

W—C layer: By adjusting a sputtering power to be applied to W and graphite, the composition ratio between W and C was tilted.

(5) Stress relaxation layer (graded layer)-forming condition

Graded layer: Sputtering was performed at a constant electric power, and a DC bias voltage was changed in a step width shown below to tilt a film density.

Step width of bias voltage: As the width of a voltage to be changed stepwise from a bias voltage at a start time to a bias voltage at an end, one voltage was selected from among three kinds of voltages 25V, 50V, and 100V.

Figure 5:
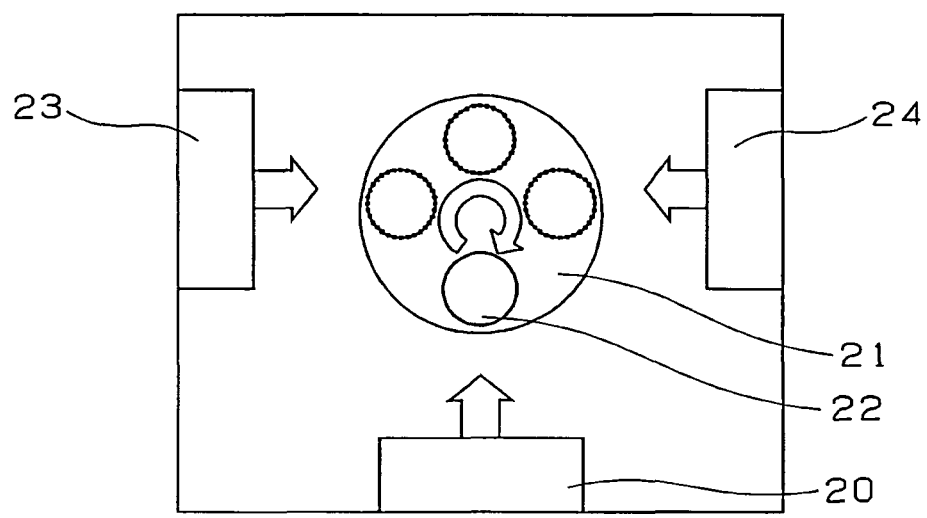
FIG. 5 is a schematic view of the UBMS apparatus having an AIP function.

Maintenance period of time at each step: five minutes (6) Uppermost surface layer-forming condition Film forming period of time: 180 minutes The outline of the UBMS 202/AIP composite apparatus is shown in FIG. 5. FIG. 5 is a schematic view of the UBMS apparatus having an arc ion plating (hereinafter referred to as AIP) function. As shown in FIG. 5, a UBMS 202/AIP composite apparatus has an AIP function of instantaneously vaporizing and ionizing an AIP evaporation source material 20 by utilizing vacuum arc discharge and depositing it on the base material 22 to form a film and a UBMS function capable of controlling the property of a film formed by depositing a sputter evaporation source material (target) 23, 24 on the base material in a nonequilibrium magnetic field by increasing a plasma density in the vicinity of the base material 22 to increase an ion assist effect. This apparatus is capable of forming a composite film consisting of an AIP film and a plurality of a UBMS film (including graded composition) arbitrarily combined with each other on the base material.

Examples 1 through 7, 18, 19 and Comparative Example 2

An intermediate layer shown in table 1 was formed on the substrate subjected to ultrasonic cleaning with acetone and dried in the intermediate layer-forming condition. Thereafter a graded layer was formed at the 25V step of the above-described graded layer-forming condition. Finally at a substrate bias voltage of the DLC film-forming condition shown in table 1, the DLC film was formed. The film-forming period of time was 180 minutes. In this manner, the specimen of the hard multilayer film formed body of each example and the comparative example 2 was obtained. The film thickness of each of the obtained specimens was measured. The specimens were subjected to a Rockwell indentation test and a friction test shown below to evaluate the adhesion and wear resistance thereof. Table 1 shows the results.

<Rockwell Indentation Test>

When the diamond indenter was stricken into a specimen base material at the load of 150 kg, the peeling-generated situation on the periphery of the impression thereof was observed. From the observed peeling-generated situation, the adhesion of each of the specimens was evaluated based on the evaluation criterion shown in FIG. 3. Specimens which had a small amount of peeling as shown in FIG. 3(a) were evaluated as excellent in the adhesion thereof, and a mark "A" was recorded. Specimens in which peeling occurred partly as shown in FIG. 3(b) were evaluated as sufficient in the adhesion thereof and a mark "B" was recorded. Specimens in which peeling occurred on the entire periphery of the impression as shown in FIG. 3(c) were evaluated as inferior in the adhesion thereof and a mark "C" was recorded.

<Friction Test>

Figure 2:
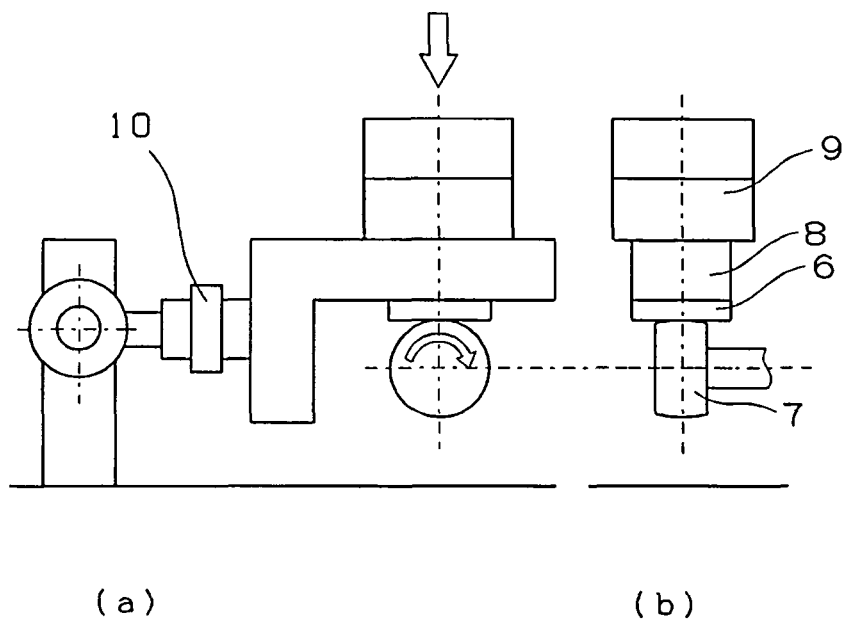
FIG. 2 shows a frictional tester.

The obtained specimens were subjected to the friction test by using a friction tester shown in FIG. 2. FIG. 2(a) is a front view. FIG. 2(b) is a side view. An SUJ2 hardened steel having a surface roughness Ra not more than 0.01 μm and a Vickers hardness Hv of 780 is set as a mating material 7 and mounted on a rotational shaft. A specimen 6 is fixed to an arm portion 8. With a predetermined load 9 being applied to the arm portion 8 from above in FIG. 2, the mating material 7 is rotated for 60 minutes at a Hertz maximum contact surface pressure of 0.5 GPa, a room temperature (25° C.), and a rotational speed of 0.05 m/second to detect a frictional force generated between the mating material 7 and the specimen 6 by a load cell. The specific wear volume of the specimen 6 is computed from the detected frictional force. When the specific wear volume is less than $100\times10^{-10}$ mm/(N·m), a mark "A" is recorded. When the specific wear volume is more than $100\times10^{-10}$ mm/(N·m) nor more than $300\times10^{-10}$ mm/(N·m), a mark "B" is recorded. When the specific wear volume exceeds $300\times10^{-10}$ mm/(N·m), a mark "C" is recorded.

Examples 8 through 14

The intermediate layer shown in table 1 was formed on the substrate subjected to the ultrasonic cleaning with the acetone and dried in the intermediate layer-forming condition. Thereafter the graded layer was formed at the 50V step of the graded layer-forming condition. Finally at the substrate bias voltage of DLC film-forming condition shown in table 1, the DLC film was formed. The film-forming period of time was 180 minutes. In this manner, the specimen of the hard multilayer film formed body of each example was obtained. The film thickness of each of the obtained specimens was measured. The specimens were subjected to the above-described Rockwell indentation and friction tests to evaluate the adhesion and wear resistance thereof. Table 1 shows the results.

Examples 15, 17

Except that methane gas was used at the ratio shown in table 1 for 100 parts by volume of Ar, treatment and evaluation similar to those of the example 1 were made. Table 1 shows the results.

Example 16

The intermediate layer shown in table 1 was formed on the substrate subjected to the ultrasonic cleaning with the acetone and dried in the intermediate layer-forming condition. Thereafter the graded layer was formed at the 100V step of the graded layer-forming condition. Finally at the substrate bias voltage of the DLC film-forming condition shown in table 1, the DLC film was formed. The film-forming period of time was 180 minutes. In this manner, the specimen of the hard multilayer film formed body was obtained. The film thickness of the obtained specimen was measured. The specimen was subjected to the above-described Rockwell indentation and friction tests to evaluate the adhesion and wear resistance thereof. Table 1 shows the results.

Comparative Example 1

The intermediate layer shown in table 1 was formed on the substrate subjected to the ultrasonic cleaning with the acetone and dried in the intermediate layer-forming condition. Thereafter at the substrate bias voltage of the DLC film-forming condition shown in table 1, the DLC film was formed. The film-forming period of time was 180 minutes. In this manner, the specimen of the hard multilayer film formed body was obtained. The film thickness of the obtained specimen was measured. The specimen was subjected to the Rockwell indentation and friction tests to evaluate the adhesion and wear resistance thereof. Table 1 shows the results.

Comparative Example 3

The DLC film was formed on the substrate subjected to ultrasonic cleaning with the acetone and dried at the substrate bias voltage of the DLC film shown in table 1 to obtain a specimen of the hard multilayer film formed body. The film-forming period of time was 180 minutes. In this manner, the specimen of the hard multilayer film formed body was obtained. The film thickness of the obtained specimen was measured. The specimen was subjected to the above-described Rockwell indentation and friction tests to evaluate the adhesion and wear resistance thereof. Table 1 shows the results.

TABLE 1

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Whether intermediate layer was formed or not, "○": Yes, "—": No | | | | | | | | | | | |
| Cr layer | ○ | ○ | ○ | ○ | — | ○ | ○ | ○ | ○ | ○ | ○ |
| W layer | ○ | ○ | ○ | ○ | ○ | ○ | ○ | ○ | ○ | ○ | ○ |
| W-C layer | ○ | ○ | ○ | ○ | ○ | ○ | ○ | ○ | ○ | ○ | ○ |
| Bias voltage for forming graded layer | | | | | | | | | | | |
| 25 V step | ○ | ○ | ○ | ○ | ○ | ○ | ○ | — | — | — | — |
| 50 V step | — | — | — | — | — | — | — | ○ | ○ | ○ | ○ |
| 100 V step | — | — | — | — | — | — | — | — | — | — | — |
| Condition for forming DLC film | | | | | | | | | | | |
| Bias voltage applied to substrate (V) | 250 | 300 | 350 | 400 | 300 | 300 | 300 | 250 | 300 | 350 | 400 |
| Use of methane gas [1] in combination with Ar gas (part by volume) | — | — | — | — | — | — | — | — | — | — | — |
| Temperature of base material (° C.) | 200 | 200 | 200 | 200 | 200 | 300 | 100 | 200 | 200 | 200 | 200 |
| Total thickness (μm) | 1.8 | 1.7 | 1.6 | 1.5 | 1.3 | 1.4 | 1.4 | 1.6 | 1.5 | 1.4 | 1.3 |
| Evaluation of adhesion | A | A | A | A | B | A | A | A | A | A | A |
| Evaluation of wear resistance | A | A | A | A | A | A | A | A | A | A | A |

| | Example | | | | | | | | Comparative example | | |
|---|---|---|---|---|---|---|---|---|---|---|---|
| | 12 | 13 | 14 | 15 | 16 | 17 | 18 | 19 | 1 | 2 | 3 |
| Whether intermediate layer was formed or not, "○": Yes, "—": No | | | | | | | | | | | |
| Cr layer | — | ○ | ○ | ○ | ○ | ○ | — | ○ | ○ | — | — |
| W layer | ○ | ○ | ○ | ○ | ○ | ○ | ○ | ○ | ○ | — | — |
| W-C layer | ○ | ○ | ○ | ○ | ○ | ○ | ○ | ○ | ○ | ○ | — |
| Bias voltage for forming graded layer | | | | | | | | | | | |
| 25 V step | — | — | — | ○ | — | ○ | ○ | ○ | — | ○ | — |
| 50 V step | ○ | ○ | ○ | — | — | — | — | — | — | — | — |
| 100 V step | — | — | — | — | ○ | — | — | — | — | — | — |
| Condition for forming DLC film | | | | | | | | | | | |
| Bias voltage applied to substrate (V) | 300 | 300 | 300 | 300 | 300 | 200 | 200 | 200 | 300 | 200 | 200 |
| Use of methane gas [1] in combination with Ar gas (part by volume) | — | — | — | 5 | — | 10 | — | — | — | — | — |

TABLE 1-continued

| Temperature of base material (° C.) | 200 | 300 | 100 | 200 | 200 | 200 | 200 | 200 | 200 | 200 | 200 |
|---|---|---|---|---|---|---|---|---|---|---|---|
| Total thickness (μm) | 1.1 | 1.2 | 1.2 | 2.1 | 1.6 | 2.6 | 1.5 | 1.5 | 1.5 | 1.4 | 1.1 |
| Evaluation of adhesion | B | A | A | A | B | B | B | A | C | C | C |
| Evaluation of wear resistance | A | A | A | B | B | B | B | B | B | B | C |

[1] Part by volume of methane gas, for 100 parts by volume of Ar gas, which was used as sputtering gas in combination with Ar gas The hard multilayer film formed bodies of the examples 1 through 19 showed sufficient adhesion and wear resistance. On the other hand, the specimen of the comparative example 1 in which the graded layer was not formed was inferior in its adhesion. The specimen of the comparative example 2 in which the intermediate layer composed of a predetermined metallic material was not formed was inferior in its adhesion. The specimen of the comparative example 3 in which neither the intermediate layer nor the graded layer was formed was inferior in its adhesion and wear resistance.

Tables 2 and FIG. 6 show the relationship between the bias voltage in forming the surface layer and the specific wear volume in the friction test.

TABLE 2

| Bias voltage V | Specific wear volume $\times 10^{-10}$ mm$^3$/(N·m) | |
|---|---|---|
| 100 | 400 | — |
| 200 | 170 | Example 19 |
| 250 | 95 | Example 1 |
| 300 | 80 | Example 2 |
| 350 | 85 | Example 3 |
| 400 | 90 | Example 4 |

As shown in table 2 and FIG. 6, by setting the bias voltage in forming the surface layer (DLC layer) to not less than 250V, the specific wear volume can be greatly reduced.

Figure 7:
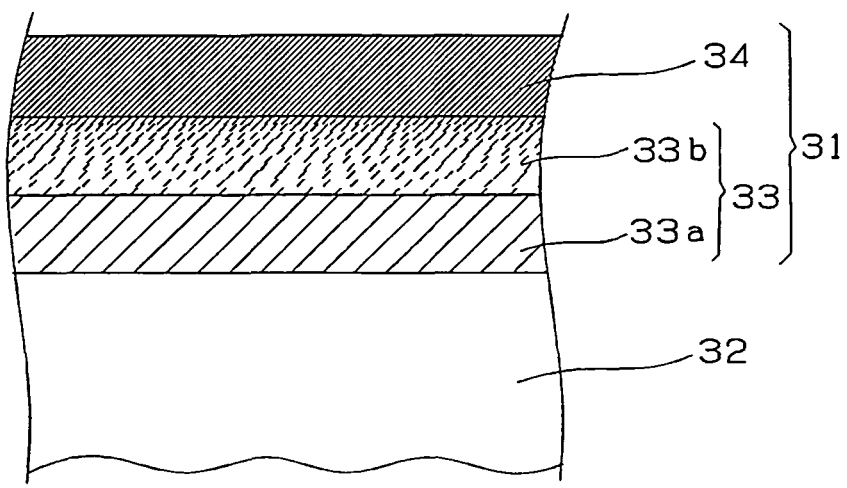
FIG. 7 is a sectional view showing the structure of the hard multilayer film formed body.

By optimizing the surface layer-forming step in the UBMS method, it is possible to improve the wear resistance, the adhesion, and the surface smoothness to a higher extent and form a thick film. For example, a film-forming condition for satisfying the following properties (A) through (C) of a hard multilayer film formed body 31 composed of an intermediate layer 33 (33a+33b) formed on the surface of a base material 32 and a surface layer 34 shown in FIG. 7 are described below.

[Property (A)]

(A) By setting the SUJ2 hardened steel having the surface roughness Ra not more than 0.01 μm and the Vickers hardness Hv 780 as the mating material, the hard multilayer film formed body was brought into contact with the mating material by applying a load of the Hertz maximum contact surface pressure of 0.5 GPa to the hard multilayer film formed body. The hard multilayer film formed body has a specific wear volume less than $150 \times 10^{-10}$ mm/(N·m) when the mating material is rotated for 30 minutes at a rotational speed of 0.05 m/second. The total of the average value of indentation hardnesses and the standard deviation was 25 to 45 GPa.

The surface layer-forming step for obtaining the hard multilayer film formed body 31 having the property (A) is the step of forming the surface layer 34 composed mainly of the DLC by depositing carbon atoms generated from a target serving as a carbon supply source on the intermediate layer 33 in conditions where a vacuum degree inside the UBMS apparatus is 0.2 to 0.9 Pa and the bias voltage applied to the base material 32 is 70 to 400V. When the vacuum degree inside the UBMS apparatus or the bias voltage to be applied to the base material 32 is out of the above-described range, the hard multilayer film formed body is incapable of obtaining the above-described property (A). The vacuum degree inside the UBMS apparatus is more favorably 0.25 to 0.82 Pa. The bias voltage to be applied to the base material is more favorably 100 to 400V.

Because the surface layer 34 is composed mainly of the DLC, a graphite target is used as the carbon supply source at a film-forming time. By using the graphite target and the hydrocarbon gas in combination as the carbon supply source, it is possible to improve the adhesion of the surface layer to the intermediate layer. As the hydrocarbon gas, the methane gas, acetylene gas, and benzene are used. Although the hydrocarbon gas is not limited to a specific gas, the methane gas is preferable in consideration of its cost and handleability.

In using the graphite target and the hydrocarbon gas in combination as the carbon supply source, it is preferable that the ratio of the introduction amount of the hydrocarbon gas to the introduction amount of the Ar gas into the UBMS apparatus (into film-forming chamber) is 1 to 5, supposing that the introduction amount of the Ar gas is 100. By setting the ratio of the introduction amount of the hydrocarbon gas to this range, it is possible to improve the adhesion of the surface layer, maintain the hardness of the hard multilayer film formed body, and decrease the specific wear volume. The introduction amount of the Ar gas used as the sputtering gas is for example, 50 to 200 ml/minute.

The step of forming the intermediate layer 33 is as described above. It is preferable that at the surface layer-forming step, the DLC graded layer (stress relaxation layer) is formed by using the graphite target in the UBMS method and continuously or stepwise increasing the bias voltage to be applied to the base material before an uppermost surface is formed.

It is preferable to set the total of the film thickness of the double layer consisting of the intermediate layer and the surface layer to 0.5 to 3.0 μm. When the total of the film thicknesses is less than 0.5 μm, the wear resistance and mechanical strength of the hard multilayer film formed body 31 are inferior. When the total of the film thickness of the double layer is more than 3.0 μm, peeling is liable to occur.

Reference examples and reference comparative examples of the hard multilayer film formed body having the property (A) are shown below. The base material, the UBMS apparatus, and the sputtering gas used and the intermediate layer-forming condition set in the reference examples and the reference comparative examples are as shown below:

(1) Base material: SUS440C or cemented carbide
(2) Dimension of base material: mirror-like surface (Ra=about 0.005 μm), 30 mm square, thickness: 5 mm
(3) UBNS apparatus: UBMS 202/AIP composite apparatus produced by Kobe Steel, Ltd (see FIG. 5)
(4) Sputtering gas: Ar gas
(5) Intermediate layer-forming condition Cr layer: Vacuumed up to $5 \times 10^{-3}$ Pa. The base material was baked by a heater. After the surface of the base material was etched with Ar plasma, a Cr layer was formed by the UBMS method.

WC—C layer: Vacuumed up to $5 \times 10^{-3}$ Pa. The base material was baked at a predetermined temperature by a heater.

After the surface of the base material (or surface of Cr layer) was etched with Ar plasma, by adjusting a sputtering power to be applied to WC and graphite, the composition ratio between WC and C was graded.

Reference Examples 1A through 4A, 6A through 11A, Reference Comparative Examples 1A, 3A through 6A After the base material shown in table 3 was subjected to ultrasonic cleaning with the acetone, it was dried. After the base material was mounted on the UBMS/AIP apparatus, the Cr layer and the WC—C layer shown in table 3 were formed in the above-described intermediate layer-forming condition. In the film-forming condition shown in table 3, the DLC film which is the surface layer was formed on the Cr layer and the WC—C layer to obtain the specimen of each of the reference examples and the reference comparative examples having a hard film respectively. The "vacuum degree" shown in table 3 is the vacuum degree inside the film-forming chamber in the above-described apparatus. The obtained specimens were subjected to a friction test, a hardness test, and a film thickness test shown below to measure the specific wear volume, dynamic friction coefficient, indentation hardness, and film thickness thereof. Table 3 shows the results.

<Friction Test>

The obtained specimens were subjected to the friction test by using the friction tester shown in FIG. 2. FIG. 2(a) is a front view. FIG. 2(b) is a side view. The SUJ2 hardened steel having the surface roughness Ra not more than 0.011 μm and the Vickers hardness Hv 780 was set as the mating material 7 and mounted on the rotational shaft. The specimen 6 was fixed to the arm portion 8. With the predetermined load 9 being applied to the arm portion 8 from above in FIG. 2, the mating material 7 was rotated for 30 minutes without interposing a lubricant between the specimen 6 and the mating material 7 at the Hertz maximum contact surface pressure of 0.5 GPa, the room temperature (25° C.), and the rotational speed of 0.05 m/second to detect the frictional force generated between the mating material 7 and a specimen 6 by the load cell. The specific wear volume of the specimen 6 was computed from the detected frictional force. The dynamic friction coefficient was also recorded.

<Hardness Test>

Figure 8:
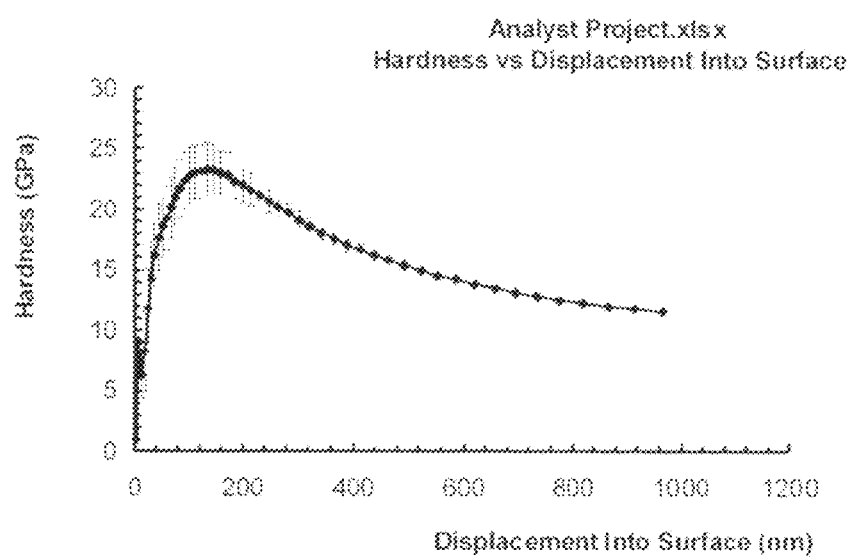
FIG. 8 shows an example of a measurement result of an indentation hardness when a nano-indenter is used (reference example 3).

The indentation hardness of each of the obtained specimens was measured by using a Nano Indenter (G200) produced by Agilent Technologies Inc. Table 3 shows the results of the measurement. Each of the measured values shows the average value of depths (portions where hardness was stable) not influenced by the surface roughness. The indentation hardness of each specimen was measured at 10 portions thereof. In the case of a measurement example (reference example 3A) shown in FIG. 8, because the hardness of a location having a depth of 0.12 μm is stable, a hardness 23 GPa at this depth is adopted.

<Film Thickness Test>

The film thickness of each of the obtained specimens was measured by using a surface configuration surface roughness measuring instrument (Form Talysurf PGI830 produced by Taylor Hobson Inc.). A film-forming portion was partly masked to compute the film thickness from the level difference between a portion where a film was not formed and a portion where a film was formed.

Reference Example 5A and Reference Comparative Example 2A

After the base material (Vickers hardness Hv 1000) subjected to plasma nitrogen treatment shown in table 3 by using a radical nitriding device produced by NDK, Incorporated. was subjected to the ultrasonic treatment with the acetone, the base material was dried. After the base material was mounted on the UBMS/AIP apparatus, the Cr layer and the WC—C layer shown in table 3 were formed in the above-described intermediate layer-forming condition. In the film-forming condition shown in table 3, the DLC film which is the surface layer was formed on the Cr layer and the WC—C layer to obtain the specimen of each of the reference example 5A and reference comparative example 2A having a hard film respectively. The obtained specimens were subjected to the above-described friction, hardness, and film thickness tests to measure the specific wear volume, dynamic friction coefficient, indentation hardness, the film thickness thereof. Table 3 shows the results.

TABLE 3

|  | Reference example | | | | | | | | | | |
|---|---|---|---|---|---|---|---|---|---|---|---|
|  | 1A | 2A | 3A | 4A | 5A | 6A | 7A | 8A | 9A | 10A | 11A |
| Material [1] | SUS | Super-hard | SUS | SUS | SUS | SUS | SUS | SUS | SUS | SUS | SUS |
| Whether surface-treated or not, "○": Yes, "—": No | — | — | — | — | ○ | — | — | — | — | — | — |
| Hardness of nitride layer (Hv) | — | — | — | — | 1000 | — | — | — | — | — | — |
| Temperature of base material (° C.) | 150 | 200 | 200 | 200 | 200 | 200 | 200 | 200 | 200 | 200 | 200 |
| Whether intermediate layer was formed or not, "○": Yes, "—": No | | | | | | | | | | | |
| Cr layer | ○ | — | ○ | ○ | ○ | ○ | ○ | ○ | ○ | ○ | ○ |
| WC-C layer | ○ | ○ | ○ | ○ | ○ | ○ | ○ | ○ | ○ | ○ | ○ |
| Surface layer | | | | | | | | | | | |
| Bias (minus) voltage applied to base material (V) | 100 | 200 | 200 | 250 | 300 | 300 | 300 | 400 | 100 | 100 | 100 |
| Introduction ratio of methane gas [2] | — | — | — | — | — | — | — | — | 1 | 3 | 5 |
| Vacuum degree (Pa) | 0.25 | 0.45 | 0.82 | 0.46 | 0.24 | 0.45 | 0.81 | 0.82 | 0.25 | 0.25 | 0.25 |
| Film-forming period of time (minute) | 180 | 180 | 180 | 180 | 180 | 180 | 180 | 180 | 180 | 180 | 180 |
| Specific wear volume, $\times 10^{-10}$ mm$^3$/(N·m) | 95 | 100 | 120 | 70 | 80 | 60 | 60 | 70 | 80 | 100 | 145 |
| Dynamic friction coefficient | 0.27 | 0.31 | 0.29 | 0.30 | 0.31 | 0.29 | 0.27 | 0.28 | 0.31 | 0.39 | 0.39 |
| Thickness (μm) | 1.2 | 1.2 | 1.2 | 1.1 | 1.1 | 1.0 | 1.0 | 1.0 | 1.2 | 1.4 | 1.4 |

TABLE 3-continued

| Indentation hardness | | | | | | | | | | | |
|---|---|---|---|---|---|---|---|---|---|---|---|
| Average value (Gpa) | 37.4 | 27.7 | 23.0 | 26.6 | 38.8 | 36.8 | 23.2 | 24.0 | 36.4 | 29.5 | 26.4 |
| Standard deviation (σ) | 4.6 | 3.4 | 2.1 | 4.3 | 3.1 | 3.0 | 2.1 | 1.9 | 6.3 | 5.2 | 4.9 |
| Average value + Standard deviation | 42.0 | 31.1 | 25.1 | 30.9 | 41.9 | 39.8 | 25.3 | 25.9 | 42.7 | 34.7 | 31.3 |

| | Reference comparative example | | | | | |
|---|---|---|---|---|---|---|
| | 1A | 2A | 3A | 4A | 5A | 6A |
| Material [1] | SUS | SUS | SUS | SUS | Super-hard | Super-hard |
| Whether surface-treated or not, "○": Yes, "—": No | — | ○ | — | — | — | — |
| Hardness of nitride layer (Hv) | — | 1000 | — | — | — | — |
| Temperature of base material (° C.) | 200 | 200 | 200 | 200 | 200 | 200 |
| Whether intermediate layer was formed or not, "○": Yes, "—": No | | | | | | |
| Cr layer | ○ | ○ | — | ○ | — | — |
| WC-C layer | ○ | ○ | — | ○ | ○ | ○ |
| Surface layer | | | | | | |
| Bias (minus) voltage applied to base material (V) | 200 | 100 | 200 | 100 | 50 | 100 |
| Introduction ratio of methane gas [2] | — | — | — | — | 3 | 10 |
| Vacuum degree (Pa) | 1.20 | 1.10 | 0.45 | 0.14 | 0.25 | 0.27 |
| Film-forming period of time (minute) | 180 | 180 | 180 | 180 | 180 | 180 |
| Specific wear volume, ×$10^{-10}$ mm$^3$/(N·m) | 180 | 160 | | | 5) | 400 |
| Dynamic friction coefficient | 0.31 | 0.30 | | | 0.30 | 0.45 |
| Thickness (μm) | 1.1 | 1.1 | | | 1.0 | 1.8 |
| Indentation hardness | | | 3) | 4) | | |
| Average value (Gpa) | 18.6 | 19.0 | | | 21.1 | 19.6 |
| Standard deviation (σ) | 1.1 | 4.0 | | | 3.4 | 4.3 |
| Average value + Standard deviation | 19.7 | 23.0 | | | 24.5 | 23.9 |

[1] SUS is the abbreviation of SUS440C. "Super-hard" is the abbreviation of cemented carbide.
[2] "—" indicates that Ar gas was used singly. Introduction ratio of methane gas indicates ratio of introduction amount of methane gas to introduction amount 100 of Ar gas.
3) Spontaneous peeling occurred immediately after specimen was taken out of film-forming chamber.
4) Plasma was not generated and film could not be formed.
5) Base material was exposed owing to wear of film.

Because as shown in table 3, in the reference examples 1A through 11A, the films were formed in the predetermined condition, it was possible to obtain the DLC film in which the specific wear volume was less than 150×$10^{-10}$ mm/(N·m) and the total value of the average value of the indentation hardnesses and the standard deviation was not less than 25 GPa. Thus the DLC film had an excellent wear resistance. All of the specimens of the reference examples 1A through 11A had a dynamic friction coefficient not more than 0.4.

On the other hand, in the specimen of the reference comparative example 1A, the total value of the average value of the indentation hardnesses and the standard deviation was 19.7 GPa which was less than 25 GPa. In the specimen of the reference comparative example 2A, the total value of the average value of the indentation hardnesses and the standard deviation was 23 GPa which was less than 25 GPa. Because the intermediate layer was not formed in the specimen of the reference comparative example 3A, the adhesion thereof was insufficient. Because the Ar plasma could not be generated in the specimen of the reference comparative example 4A, a film could not be formed. Because a low bias voltage was applied to the specimen of the reference comparative example 5A, the total value of the average value of the indentation hardnesses and the standard deviation was 24.5 GPa which was less than 25 GPa and thus the wear resistance thereof was inferior. Because the introduction ratio of the methane gas was high, the specimen of the reference comparative example 6A had a low hardness and an inferior wear resistance.

[Property (B)]
(B) By setting the SUJ2 hardened steel having the surface roughness Ra not more than 0.01 μm and a Vickers hardness Hv 780 as the mating material, the hard multilayer film formed body was brought into contact with the mating material by applying the load of the Hertz maximum contact surface pressure of 0.5 GPa to the hard multilayer film formed body. The specific wear volume of the hard multilayer film formed body when the mating material was rotated for 30 minutes at the rotational speed of 0.05 m/second was less than 150×$10^{-10}$ mm/(N·m), and the surface layer has a predetermined film thickness. That the surface layer has the predetermined film thickness means that the surface layer has a film thickness not less than 1.5 μm when the time required to form the film of the surface layer is 540 minutes or the surface layer has a film thickness not less than 1.0 μm when the time required to form the film of the surface layer is 180 minutes. When the film thickness of the surface layer is less than 1.0 μm, the hard multilayer film formed body is inferior in its wear resistance, which is unpreferable.

The surface layer-forming step for obtaining the hard multilayer film formed body 31 having the property (B) is the step of forming the surface layer 34 composed mainly of the DLC by using the graphite target and the hydrocarbon gas in combination as the carbon supply source at a predetermined ratio and depositing carbon atoms generated from the carbon supply source on the intermediate layer 33 in conditions where the vacuum degree inside the UBMS apparatus (inside chamber) is 0.2 to 0.8 Pa, and the bias voltage applied to the base material 32 is 70 to 150V.

The surface layer 34 is composed mainly of the DLC. The graphite target and the hydrocarbon gas are used in combination as the carbon supply source at the film-forming time. By using the graphite target and the hydrocarbon gas in combination, it is possible to improve the adhesion of the surface layer to the intermediate layer. As the hydrocarbon gas, the methane gas, the acetylene gas, and the benzene are used. Although the hydrocarbon gas is not limited to a specific gas, the methane gas is preferable in consideration of its cost and handleability.

The ratio of the introduction amount of the hydrocarbon gas to the introduction amount of the Ar gas into the UBMS apparatus (into film-forming chamber) is set to 1 to 5, supposing that the introduction amount of the Ar gas is 100. By setting the ratio of the introduction amount of the hydrocarbon gas to this range, it is possible to improve the adhesion of the surface layer and thicken the surface layer without deteriorating the wear resistance thereof.

The introduction amount of the Ar gas used as the sputtering gas is favorably 40 to 150 ml/minute, more favorably 50 to 150 ml/minute, and most favorably 50 to 100 ml/minute. When the flow rate of the Ar gas is less than 40 ml/minute, there is a case in which the Ar plasma is not generated and the DLC film cannot be formed. When the flow rate of the Ar gas is more than 150 ml/minute, a reverse sputter phenomenon is liable to occur. Thus the wear resistance of the surface layer deteriorates and it is difficult to thicken the surface layer. When the introduction amount of the Ar gas is large, the probability of collision between Ar atoms and carbon atoms increases in the chamber. As a result, the number of the Ar atoms which reach the surface of the DLC film decreases. Thereby the effect of hardening the DLC film to be produced by the Ar atom deteriorates, and the wear resistance of the DLC film deteriorates.

As described above, the vacuum degree inside the UBMS apparatus (inside chamber) is 0.2 to 0.8 Pa and favorably 0.24 to 0.45 Pa. When the vacuum degree is less than 0.2 Pa, there is a case in which the Ar plasma is not generated and thus the DLC film cannot be formed. When the vacuum degree is more than 0.8 Pa, the reverse sputter phenomenon is liable to occur. Thus the wear resistance of the DLC film deteriorates, and it is difficult to thicken it.

The bias voltage to be applied to the base material is 70 to 150V, as described above. It is more favorable that the bias voltage is 100 to 150V. When the bias voltage is less than 70V, densification does not proceed and the wear resistance of the DLC film deteriorates extremely, which is unpreferable. When the bias voltage is more than 150V, the reverse sputter phenomenon is liable to occur. Thus the wear resistance of the DLC film deteriorates and it is difficult to thicken it.

The step of forming the intermediate layer 33 is as described above. It is preferable that at the surface layer-forming step, the DLC graded layer (stress relaxation layer) is formed by using the graphite target in the UBMS method and continuously or stepwise increasing the bias voltage to be applied to the base material before an uppermost surface is formed.

Reference examples and reference comparative examples of the hard multilayer film formed body having the property (B) are shown below. The base material, the UBMS apparatus, and the sputtering gas used and the intermediate layer-forming condition set in the reference examples and the reference comparative examples are as shown below:

(1) Base material: SUS440C or cemented carbide
(2) Dimension of base material: mirrored surface (Ra=about 0.005 μm), 30 mm square, thickness: 5 mm
(3) UBMS apparatus: UBMS 202/AIP composite apparatus produced by Kobe Steel, Ltd (see FIG. 5)
(4) Sputtering gas: Ar gas
(5) Intermediate layer-forming condition Cr layer: Vacuumed up to $5 \times 10^{-3}$ Pa. The base material was baked by a heater. After the surface of the base material was etched with Ar plasma, a Cr layer was formed by the UBMS apparatus.

WC—C layer: Vacuumed up to $5 \times 10^{-3}$ Pa. The base material was baked at a predetermined temperature by a heater. After the surface of the base material (or surface of Cr layer) was etched with Ar plasma, by adjusting a sputtering power to be applied to WC and graphite by the UBMS apparatus, the composition ratio between WC and C was tilted.

Reference Examples 1B, 4B, 5B and Reference Comparative Examples 1B, 2B, 4B Through 6B After the base material shown in table 4 was subjected to the ultrasonic treatment with the acetone, it was dried. After the base material was mounted on the UBMS/AIP apparatus, the Cr layer and the WC—C layer shown in table 4 were formed in the above-described intermediate layer-forming condition. In the film-forming condition shown in table 4, the DLC film which is the surface layer was formed on the Cr layer and the WC—C layer to obtain the specimen of each of the reference example and the reference comparative example having a hard film respectively. The "vacuum degree" shown in table 4 is the vacuum degree inside the film-forming chamber in the above-described apparatus. The obtained specimens were subjected to a friction test, a Rockwell indentation test, and a film thickness test shown below to measure or evaluate the specific wear volume, dynamic friction coefficient, adhesion, and film thickness thereof. Table 4 shows the results.

<Friction Test>

The obtained specimens were subjected to the friction test by using the friction tester shown in FIG. 2. FIG. 2(a) is a front view. FIG. 2(b) is a side view. The SUJ2 hardened steel having the surface roughness Ra not more than 0.01 μm and the Vickers hardness Hv 780 was set as the mating material 7 and mounted on the rotational shaft. The specimen 6 was fixed to the arm portion 8. With the predetermined load 9 being applied to the arm portion 8 from above in FIG. 2, the mating material 7 was rotated for 30 minutes without interposing the lubricant between the specimen 6 and the mating material 7 at the Hertz maximum contact surface pressure of 0.5 GPa, the room temperature (25° C.), and the rotational speed of 0.05 m/second to detect the frictional force generated between the mating material 7 and a specimen 6 by the load cell. The specific wear volume of the specimen 6 was computed from the detected frictional force. The dynamic friction coefficient was also recorded.

<Rockwell Indentation Test>

Figure 9:
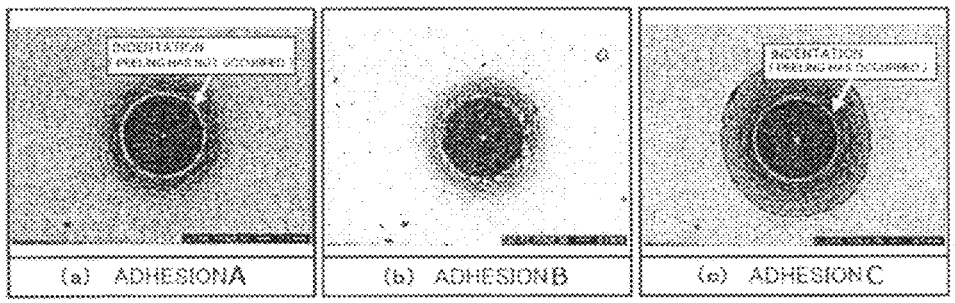
FIG. 9 shows an evaluation criterion of adhesion.

When the diamond indenter was stricken into a specimen base material at the load of 150 kg, the peeling-generated situation on the periphery of the impression thereof was observed. From the observed peeling-generated situation, the adhesion of each of the specimens was evaluated based on the evaluation criterion shown in FIG. 9. Specimens which had a small amount of peeling as shown in FIG. 9(a) were evaluated as excellent in the adhesion thereof, and a mark "A" was recorded. Specimens in which peeling occurred partly as shown in FIG. 9(b) were evaluated as sufficient in the adhesion thereof and a mark "B" was recorded. Specimens in which peeling occurred on the entire periphery of the impression as shown in FIG. 9(c) were evaluated as inferior in the adhesion thereof and a mark "C" was recorded.

<Film thickness Test>

The film thickness of each of the obtained specimens was measured by using the surface configuration surface roughness measuring instrument (Form Talysurf PGI830 produced by Taylor Hobson Inc.). A film-forming portion was partly masked to compute the film thickness from the level difference between a portion where a film was not formed and a portion where a film was formed.

Reference Example 2B, 3B and Reference Comparative Example 3B

After the base material (Vickers hardness Hv 1000) subjected to plasma nitrogen treatment shown in table 4 by using the radical nitriding device produced by NDK, Incorporated, was subjected to the ultrasonic treatment with the acetone, the base material was dried. After the base material was mounted on the UBMS/AIP apparatus, the Cr layer and the WC—C layer shown in table 4 were formed in the above-described intermediate layer-forming condition. In the film-forming condition shown in table 4, the DLC film which is the surface layer was formed on the Cr layer and the WC—C layer to obtain the specimen of each of the reference examples and reference comparative example 3B having a hard film respectively. The obtained specimens were subjected to the above-described friction test, Rockwell indentation test, and film thickness test to measure or evaluate the specific wear volume, dynamic friction coefficient, adhesion, and film thickness thereof. Table 4 shows the results.

Because as shown in table 4, in the reference examples 1B through 5B, the films were formed in the predetermined condition, the DLC film excellent in its wear resistance and adhesion could be obtained. All of the specimens of the reference examples 1B through 5B had the dynamic friction coefficient not more than 0.4.

On the other hand, because a metal layer was not formed in the intermediate layer of the specimen of the reference comparative example 1B, the adhesion of the surface layer was insufficient. The methane gas was not introduced in the reference comparative example 3B, the adhesion of the surface layer was inferior. Because the Ar plasma could not be generated in the reference comparative example 4B, a film could not be formed. Because a low bias voltage was applied to the specimen of the reference comparative example 5B, the wear resistance of the surface layer was inferior. Because the introduction amount of the methane gas was large in the specimen of the reference comparative example 6B, the surface layer had a preferable adhesion, but had an inferior wear resistance.

Reference Examples 6B, 7B and Reference Comparative Examples 7B Through 12B

After the base material shown in table 5 was subjected to the ultrasonic cleaning with the acetone, it was dried. After the base material was mounted on the UBMS/AIP apparatus, the Cr layer and the WC—C layer shown in table 5 were formed in the above-described intermediate layer-forming condition. In the film-forming condition shown in table 5, the DLC film which is the surface layer was formed on the Cr layer and the WC—C layer to obtain the specimen of each of the reference examples and the reference comparative

TABLE 4

| | Reference example | | | | | Reference comparative example | | | | | |
|---|---|---|---|---|---|---|---|---|---|---|---|
| | 1B | 2B | 3B | 4B | 5B | 1B | 2B | 3B | 4B | 5B | 6B |
| Material [1] | SUS | SUS | SUS | SUS | SUS | SUS | SUS | SUS | SUS | Super-hard | Super-hard |
| Whether surface-treated or not, "○": Yes, "—": No | — | ○ | ○ | — | — | — | — | ○ | — | — | — |
| Hardness of nitride layer (Hv) | — | 1000 | 1000 | — | — | — | — | 1000 | — | — | — |
| Temperature of base material (° C.) | 150 | 300 | 200 | 200 | 200 | 200 | 200 | 200 | 200 | 200 | 200 |
| Whether intermediate layer was formed or not, "○": Yes, "—": No | | | | | | | | | | | |
| Cr layer | ○ | ○ | ○ | ○ | ○ | — | ○ | ○ | ○ | — | — |
| WC-C layer | ○ | ○ | ○ | ○ | ○ | — | ○ | ○ | ○ | ○ | ○ |
| Surface layer | | | | | | | | | | | |
| Bias (minus) voltage applied to base material (V) | 150 | 100 | 100 | 100 | 100 | 250 | 200 | 100 | 100 | 50 | 100 |
| Introduction amount of Ar gas (ml/minute) | 100 | 50 | 50 | 50 | 50 | 100 | 100 | 50 | 30 | 50 | 50 |
| Introduction ratio of methane gas [2] | 1.5 | 3 | 1 | 3 | 5 | — | 1.5 | — | — | 3 | 10 |
| Vacuum degree (Pa) | 0.45 | 0.25 | 0.25 | 0.25 | 0.25 | 0.44 | 0.45 | 0.24 | — | 0.25 | 0.27 |
| Film-forming period of time (minute) | 180 | 180 | 180 | 180 | 180 | 180 | 180 | 180 | 180 | 180 | 180 |
| Specific wear volume, ×10$^{-10}$ mm$^3$/(N · m) | 135 | 95 | 80 | 100 | 145 | | 165 | 95 | | 5) | 400 |
| Dynamic friction coefficient | 0.26 | 0.31 | 0.28 | 0.30 | 0.39 | | 0.31 | 0.27 | | 0.30 | 0.45 |
| Thickness (μm) | 1.2 | 1.2 | 1.1 | 1.2 | 1.4 | 3) | 1.1 | 1.0 | 4) | 1.0 | 1.8 |
| Adhesion | A | A | A | A | A | | A | C | | A | A |

[1] SUS is the abbreviation of SUS440C. "Super-hard" is the abbreviation of cemented carbide.
[2] "—" indicates that Ar gas was used singly. Introduction ratio of methane gas indicates ratio of introduction amount of methane gas to introduction amount 100 of Ar gas.
3) Spontaneous peeling occurred immediately after specimen was taken out of film-forming chamber.
4) Plasma was not generated and film could not be formed.
5) Base material was exposed owing to wear of film.

examples having a hard film respectively. The obtained specimens were subjected to the above-described friction test, film thickness test and whether the formed films were thick was evaluated as shown below to measure or evaluate the specific wear volume, dynamic friction coefficient, and film thickness thereof. Table 5 shows the results.

tively. The obtained specimen was subjected to the above-described friction test, film thickness test, and whether the formed film was thick was evaluated as shown below to measure or evaluate the specific wear volume, the dynamic friction coefficient, and the film thickness. Table 5 shows the results.

TABLE 5

|  | Reference example | | Reference comparative example | | | | | | |
|---|---|---|---|---|---|---|---|---|---|
|  | 6B | 7B | 7B | 8B | 9B | 10B | 11B | 12B | 13B |
| Material [1] | Super-hard | Super-hard | SUS | SUS | SUS | SUS | SUS | SUS | SUS |
| Whether surface-treated or not, "○": Yes, "—": No | — | — | — | — | — | — | — | — | ○ |
| Hardness of nitride layer (Hv) | — | — | — | — | — | — | — | — | 1000 |
| Temperature of base material (° C.) | 200 | 200 | 200 | 200 | 200 | 150 | 200 | 200 | 200 |
| Whether intermediate layer was formed or not, "○": Yes, "—": No | | | | | | | | | |
| Cr layer | ○ | ○ | ○ | — | ○ | ○ | ○ | ○ | ○ |
| WC-C layer | ○ | ○ | ○ | — | ○ | ○ | ○ | ○ | ○ |
| Surface layer | | | | | | | | | |
| Bias (minus) voltage applied to base material (V) | 100 | 100 | 250 | 250 | 200 | 50 | 100 | 100 | 300 |
| Introduction amount of Ar gas (ml/minute) | 50 | 50 | 100 | 100 | 100 | 50 | 30 | 50 | 200 |
| Introduction ratio of methane gas [2] | 3 | 5 | — | — | — | — | 16.7 | 10 | — |
| Vacuum degree (Pa) | 0.24 | 0.25 | 0.44 | 0.45 | 0.45 | 0.25 | 0.17 | 0.24 | 0.82 |
| Film-forming period of time (minute) | 540 | 540 | 540 | 540 | 540 | 180 | 540 | 180 | 540 |
| Specific wear volume, × $10^{-10}$ mm$^3$/(N·m) | 110 | 140 | 80 |  | 260 | 4) |  | 410 | 160 |
| Dynamic friction coefficient | 0.31 | 0.38 | 0.25 |  | 0.26 | — |  | 0.45 | 0.28 |
| Thickness (μm) | 2.3 | 2.8 | 1.3 | 3) | 0.6 | 0.9 | 5) | 1.8 | 0.8 |
| Determination as to whether thick film was formed | A | A | B |  | C | — |  | — | C |

[1] SUS is the abbreviation of SUS440C. "Super-hard" is the abbreviation of cemented carbide.
[2] "—" indicates that Ar gas was used singly. Introduction ratio of methane gas indicates ratio of introduction amount of methane gas to introduction amount 100 of Ar gas.
3) Spontaneous peeling occurred immediately after specimen was taken out of film-forming chamber.
4) Base material was exposed owing to wear of film.
5) Plasma was not generated and film could not be formed.

<Evaluation as to Whether Thick Film was Formed>

Specimens in which the DLC film composing the surface layer took 540 minutes before it was formed had a thickness not less than 1.5 μm were evaluated as excellent in the thick film-forming performance thereof and recorded with a mark "A". Specimens in which the thickness of the DLC film was 1.0 to 1.5 μm were evaluated as inferior in the thick film-forming performance thereof and recorded with a mark "B". Specimens in which the thickness of the DLC film was less than 1 μm were evaluated as markedly inferior in the thick film-forming performance thereof and recorded with a mark "C".

Reference Comparative Example 13B

After the base material (Vickers hardness Hv 1000) subjected to plasma nitrogen treatment shown in table 5 by using the radical nitriding device produced by NDK, Incorporated. was subjected to the ultrasonic treatment with the acetone, the base material was dried. After the base material was mounted on the UBMS/AIP apparatus, the Cr layer and the WC—C layer shown in table 5 were formed in the above-described intermediate layer-forming condition. In the film-forming condition shown in table 5, the DLC film which is the surface layer was formed on the Cr layer and the WC—C layer to obtain the specimen of each of the reference examples and reference comparative example 3B having a hard film respec- Because as shown in table 5, the films of the specimens of the reference examples 6B and 7B were formed in the predetermined condition, the thick DLC film excellent in its wear resistance could be obtained. The specimens of the reference examples 6B and 7B had the dynamic friction coefficient not more than 0.4.

On the other hand, the specimen of the reference comparative example 7B was excellent in its wear resistance, but a high bias voltage was applied thereto. Therefore it was impossible to make the DLC film thereof thick. Because the intermediate layer was not provided with a metal layer in the specimen of the reference comparative example 8B, the adhesion of the DLC film thereof was insufficient. Because a high bias voltage was applied to the specimen of the reference comparative example 9B, it was impossible to make the DLC film thereof thick. Because a low bias voltage was applied to the specimen of the reference comparative example 10B, the wear resistance thereof was inferior. Because the Ar plasma could not be generated in the specimen of the reference comparative example 11B, the DLC FILM film could not be formed. Because the introduction amount of the methane gas was large in the specimen of the reference comparative example 12B, it had an inferior wear resistance. Because the bias voltage applied to the specimen of the reference comparative example 13B was so high that it was impossible to make the DLC film thereof thick.

[Property (C)]

(C) By setting the SUJ2 hardened steel having the surface roughness Ra not more than 0.01 μm and a Vickers hardness HV 780 as the mating material, the hard multilayer film formed body was brought into contact with the mating material by applying a load of the Hertz maximum contact surface pressure of 0.5 GPa to the hard multilayer film formed body. The hard multilayer film formed body has the specific wear volume less than $150\times10^{-10}$ mm/(N·m) when the mating material is rotated for 30 minutes at the rotational speed of 0.05 m/second and has the predetermined surface smoothness. That the hard multilayer film formed body has the predetermined surface smoothness means that when the hard multilayer film formed body is formed on the surface of the base material, the number of projections, formed on the uppermost surface of the surface layer, which has a height not less than 0.1 μm is less than 1.5 per 1 mm in a measured length of 20 mm. When the number of projections is not less than 1.5, the smoothness of the surface layer is inferior. Thus it is difficult to apply the hard multilayer film formed body to a die and mechanical parts such as a sliding member.

The surface layer-forming step for obtaining the hard multilayer film formed body 31 having the property (C) is the step of forming the surface layer 34 composed mainly of the DLC by depositing carbon atoms generated from the target serving as the carbon supply source on the intermediate layer 33 in conditions where the vacuum degree inside the UBMS apparatus is 0.2 to 0.8 Pa, and the bias voltage applied to the base material 32 is 70 to 250V. When the vacuum degree inside the UBMS apparatus or the bias voltage to be applied to the base material 32 is out of the above-described range, the hard multilayer film formed body is incapable of obtaining the above-described property (C). The vacuum degree and the bias voltage are described below.

As described above, the vacuum degree inside the UBMS apparatus (inside chamber) is 0.2 to 0.8 Pa and more favorably 0.25 to 0.72 Pa. When the vacuum degree is less than 0.2 Pa, there is a case in which the Ar plasma is not generated and the DLC film cannot be formed. When the vacuum degree is more than 0.8 Pa, the reverse sputter phenomenon is liable to occur, and the surface of the formed DLC film is rough, which is unpreferable.

The bias voltage to be applied to the base material is 70 to 250V, as described above and more favorably 100 to 250V. When the bias voltage is less than 70V, the wear resistance of the surface layer deteriorates extremely, which is unpreferable. When the bias voltage is more than 250V, there is an increase in the number of adhered particles, and thus the surface smoothness of the surface layer deteriorates, which is unpreferable.

Because the surface layer 34 is composed mainly of the DLC, the graphite target is used as the carbon supply source at a film-forming time. By using the graphite target and the hydrocarbon gas in combination as the carbon supply source, it is possible to improve the adhesion of the surface layer to the intermediate layer. As the hydrocarbon gas, the methane gas, the acetylene gas, and the benzene are used. Although the hydrocarbon gas is not limited to a specific gas, the methane gas is preferable in consideration of its cost and handleability.

In using the graphite target and the hydrocarbon gas in combination as the carbon supply source, it is preferable that the ratio of the introduction amount of the hydrocarbon gas to the introduction amount of the Ar gas into the UBMS apparatus (into film-forming chamber) is 1 to 5, supposing that the introduction amount of the Ar gas is 100. By setting the ratio of the introduction amount of the hydrocarbon gas to this range, it is possible to improve the adhesion of the surface layer, maintain the hardness of the hard multilayer film formed body, and decrease the specific wear volume.

The introduction amount of the Ar gas used as the sputtering gas is favorably 40 to 150 ml/minute, more favorably 50 to 150 ml/minute. When the flow rate of the Ar gas is less than 40 ml/minute, there is a case in which the Ar plasma is not generated and the DLC film cannot be formed. When the flow rate of the Ar gas is more than 150 ml/minute, the reverse sputter phenomenon is liable to occur. Thus the surface of the surface layer is rough and the wear resistance thereof deteriorates, which is unpreferable. When the introduction amount of the Ar gas is large, the probability of collision between the Ar atoms and the carbon atoms increases in the chamber. As a result, the number of the Ar atoms which reach the surface of the DLC film decreases and thus the effect of hardening the DLC film to be produced by the Ar atom deteriorates and the wear resistance of the surface layer deteriorates.

The step of forming the intermediate layer 33 is as described above. To improve the surface smoothness, it is preferable to use the base material 2 having mirror finish. Specifically the surface roughness Ra of the surface of the base material 2 on which the intermediate layer is formed is set to favorably not more than 0.01 μm and more favorably about 0.005 μm. It is preferable to form the DLC graded layer (stress relaxation layer) to be obtained by using the graphite target in the UBMS method and continuously or stepwise increasing the bias voltage to be applied to the base material at the surface layer-forming step before the uppermost surface is formed.

It is preferable that the total of the film thickness of the double layer consisting of the intermediate layer and the surface layer is set to 0.5 to 3.0 μm. When the total of the film thickness of the double layer is less than 0.5 μm, the hard multilayer film formed body is inferior in its wear resistance and mechanical strength. When the total of the film thickness of the double layer exceeds 3.0 μm, peeling is liable to occur, which is unpreferable. By setting the total of the film thickness of the double layer sufficiently large with respect to the surface roughness (μm) of the base material to this range, it is possible to prevent the smoothness of the surface of the hard multilayer film formed body from deteriorating even though the surface of the base material is rough.

Reference examples and reference comparative examples of the hard multilayer film formed body having the property (C) are shown below. The base material, the UBMS apparatus, and the sputtering gas used and the intermediate layer-forming condition set in the reference examples and the reference comparative examples are as shown below:

(1) Base material: SUS440C or cemented carbide
(2) Dimension of base material: mirrored surface (Ra=about 0.005 μm), 30 mm square, thickness: 5 mm
(3) UBMS apparatus: UBMS 202/AIP composite apparatus produced by Kobe Steel, Ltd (see FIG. 5)
(4) Sputtering gas: Ar gas
(5) Intermediate layer-forming condition Cr layer: Vacuumed up to $5\times10^{-3}$ Pa. The base material was baked at a predetermined temperature by a heater. After the surface of the base material was etched with Ar plasma, a Cr layer was formed by the UBMS method.

WC—C layer: Vacuumed up to $5\times10^{-3}$ Pa. The base material was baked at a predetermined temperature by a heater. After the surface of the base material (or surface of Cr layer) was etched with Ar plasma, by adjusting a sputtering power to be applied to WC and graphite by the UBMS apparatus, the composition ratio between WC and C was tilted.

Reference Examples 1C Through 4C, 6C Through 8C, and Reference Comparative Examples 1C Through 3C, 5C Through 8C After the base material shown in table 6 was subjected to the ultrasonic cleaning with the acetone, it was dried. After the base material was mounted on the UBMS/AIP apparatus, the Cr layer and the WC—C layer shown in table 6 were formed in the above-described intermediate layer-forming condition. In the film-forming condition shown in table 6, the DLC film which is the surface layer was formed on the Cr layer and the WC—C layer to obtain the specimen of each of the reference examples and the reference comparative examples having a hard film respectively. The "vacuum degree" shown in table 6 is the vacuum degree inside the film-forming chamber in the above-described apparatus. The obtained specimens were subjected to a friction test and a surface smoothness test shown below to measure and/or evaluate the specific wear volume, dynamic friction coefficient, and the number of the adhered particles. Table 6 shows the results.

<Friction Test>

The obtained specimens were subjected to the friction test by using the friction tester shown in FIG. 2. The SUJ2 hardened steel having the surface roughness Ra not more than 0.01 μm and the Vickers hardness Hv 780 was set as the mating material 7 and mounted on the rotational shaft. The specimen 6 was fixed to the arm portion 8. With the predetermined load 9 being applied to the arm portion 8 from above in FIG. 2, the mating material 7 was rotated for 30 minutes without interposing the lubricant between the specimen 6 and the mating material 7 at the Hertz maximum contact surface pressure of 0.5 GPa, the room temperature (25° C.), and the rotational speed of 0.05 m/second to detect a frictional force generated between the mating material 7 and a specimen 6. The specific wear volume was computed from the obtained frictional force. The dynamic friction coefficient was also recorded.

<Surface Smoothness Test>

The film thickness of each of the obtained specimens was measured by using a surface configuration surface roughness measuring instrument (Form Talysurf PGI830 produced by Taylor Hobson Inc.). As a management index of the surface state of each specimen, projections having a height not less than 0.1 μm were set as an adhered particle. The number of the adhered particles per unit length present on the surface of each specimen was measured. The measured length of each specimen is 20 mm. Specimens in which the number of the adhered particles is less than 0.5/mm are evaluated as excellent in the surface smoothness thereof, and a mark "A" is recorded. Specimens in which the number of the adhered particles is 0.5 to 1.5/mm are evaluated as being on a usable level in the surface smoothness thereof, and a mark "B" is recorded. Specimens in which the number of the adhered particles exceeds 1.5/mm are evaluated as markedly inferior in the surface smoothness thereof, and a mark "C" is recorded.

Reference Example 5C and Reference Comparative Example 4C

After the base material (Vickers hardness Hv 1000) subjected to the plasma nitrogen treatment shown in table 6 by using the radical nitriding device produced by NDK, Incorporated. was subjected to the ultrasonic treatment with the acetone, the base material was dried. After the base material was mounted on the UBMS/AIP apparatus, the Cr layer and the WC—C layer shown in table 6 were formed in the above-described intermediate layer-forming condition. In the film-forming condition shown in table 6, the DLC film which is the surface layer was formed on the Cr layer and the WC—C layer to obtain the specimen of each of the reference example 5C and the reference comparative example 4C having a hard film respectively. The obtained specimens were subjected to the above-described friction test and the surface smoothness test to measure and/or evaluate the specific wear volume, dynamic friction coefficient, and the number of the adhered particles. Table 6 shows the results.

TABLE 6

|  | 1C | 2C | 3C | 4C | 5C | 6C | 7C | 8C |
|---|---|---|---|---|---|---|---|---|
|  | Reference example | | | | | | | |
| Material [1] | SUS | Super-hard | SUS | SUS | SUS | SUS | SUS | SUS |
| Whether surface-treated or not, "○": Yes, "—": No | — | — | — | — | ○ | — | — | — |
| Hardness of nitride layer (Hv) | — | — | — | — | 1000 | — | — | — |
| Temperature of base material (° C.) | 200 | 150 | 200 | 150 | 300 | 200 | 200 | 200 |
| Whether intermediate layer was formed or not, "○": Yes, "—": No | | | | | | | | |
| Cr layer | ○ | ○ | ○ | ○ | ○ | ○ | ○ | ○ |
| WC-C layer | ○ | ○ | — | ○ | ○ | ○ | ○ | ○ |
| Surface layer | | | | | | | | |
| Bias (minus) voltage applied to base material (V) | 250 | 250 | 200 | 200 | 100 | 100 | 100 | 100 |
| Introduction amount of Ar gas (ml/minute) | 100 | 50 | 150 | 50 | 50 | 50 | 50 | 50 |
| Introduction ratio of methane gas [2] | — | — | — | — | — | 1 | 3 | 5 |
| Vacuum degree (Pa) | 0.44 | 0.25 | 0.72 | 0.25 | 0.25 | 0.25 | 0.25 | 0.26 |
| Film-forming period of time (minute) | 180 | 180 | 180 | 180 | 180 | 180 | 180 | 180 |
| Specific wear volume, ×$10^{-10}$ mm$^3$/(N·m) | 70 | 85 | 110 | 90 | 60 | 80 | 100 | 145 |
| Dynamic friction coefficient | 0.24 | 0.25 | 0.27 | 0.26 | 0.25 | 0.27 | 0.31 | 0.38 |
| Number of adhered particles (number of pieces/mm) | 0.2 | 0.3 | 0.4 | 0.2 | 0.2 | 0.2 | 0.3 | 0.2 |
| Determination of number of adhered particles | A | A | A | A | A | A | A | A |

TABLE 6-continued

| | 1C | 2C | 3C | 4C | 5C | 6C | 7C | 8C |
|---|---|---|---|---|---|---|---|---|
| | | | | Reference comparative example | | | | |
| Material [1] | SUS | SUS | SUS | SUS | SUS | SUS | Super-hard | SUS |
| Whether surface-treated or not, "○": Yes, "—": No | — | — | — | ○ | — | — | — | — |
| Hardness of nitride layer (Hv) | — | — | — | 1000 | — | — | — | — |
| Temperature of base material (° C.) | 200 | 200 | 200 | 200 | 200 | 200 | 200 | 200 |
| Whether intermediate layer was formed or not, "○": Yes, "—": No | | | | | | Super-hard | | |
| Cr layer | ○ | — | ○ | ○ | ○ | ○ | ○ | ○ |
| WC-C layer | ○ | — | ○ | ○ | ○ | ○ | ○ | ○ |
| Surface layer | | | | | | | | |
| Bias (minus) voltage applied to base material (V) | 300 | 250 | 400 | 300 | 50 | 100 | 300 | 100 |
| Introduction amount of Ar gas (ml/minute) | 100 | 100 | 100 | 175 | 50 | 30 | 50 | 50 |
| Introduction ratio of methane gas [2] | — | — | — | — | — | — | — | 10 |
| Vacuum degree (Pa) | 0.45 | 0.44 | 0.45 | 0.76 | 0.25 | 0.17 | 0.25 | 0.27 |
| Film-forming period of time (minute) | 180 | 180 | 180 | 180 | 180 | 180 | 180 | 180 |
| Specific wear volume, $\times 10^{-10}$ mm$^3$/(N·m) | 80 | | 85 | 90 | 4) | | 90 | 400 |
| Dynamic friction coefficient | 0.27 | | 0.26 | 0.21 | 0.28 | | 0.24 | 0.45 |
| Number of adhered particles (number of pieces/mm) | 1.6 | 3) | 3.2 | 1.7 | 0.5 | 5) | 1.6 | 0.8 |
| Determination of number of adhered particles | C | | C | C | B | | C | B |

[1] SUS is the abbreviation of SUS440C. "Super-hard" is the abbreviation of cemented carbide.
[2] "—" indicates that Ar gas was used singly. Introduction ratio of methane gas indicates ratio of introduction amount of methane gas to introduction amount 100 of Ar gas.
3) Spontaneous peeling occurred immediately after specimen was taken out of film-forming chamber.
4) Base material was exposed owing to wear of film.
5) Plasma was not generated and film could not be formed.

Because the films of the reference examples 1C through 8C were formed in the predetermined condition, it was possible to obtain the DLC films which were excellent in the wear resistance thereof, low in the friction thereof, and had a small number of adhered particles. The specimens of the reference examples 1C through 8C had the dynamic friction coefficient not more than 0.4.

On the other hand, because a high bias voltage was applied to the specimen of the reference comparative example 1C, the number of the adhered particles was large and the surface property thereof was bad. Because the DLC film was formed without forming the intermediate layer in the specimen of the reference comparative example 2C, peeling occurred while the specimen was left as it was after it was taken out of the chamber. Because a high bias voltage was applied to the specimen of the reference comparative example 3C, the number of the adhered particles was large and the surface property thereof was bad. Because the introduction amount of the Ar gas was large in the specimen of the reference comparative example 4C, the number of the adhered particles was large and the surface property thereof was bad. Because a low bias voltage was applied to the specimen of the reference comparative example 5C, the wear resistance thereof was extremely inferior (in friction test which took 30 minutes, mating material reached base material). Because the introduction amount of the Ar gas was small in the specimen of the reference comparative example 6C, the predetermined vacuum degree could not be maintained. Therefore the Ar plasma was not generated and thus a film could not be formed. The film was formed on the carbide base material of the specimen of the reference comparative example 7C, but a high bias voltage was applied thereto. Therefore the number of the adhered particles was large and the surface property thereof was bad. Because the introduction amount of the methane gas was large in the specimen of the reference comparative example 8C, the specimen had a preferable adhesion, but had an inferior wear resistance. As described above, because the films of the specimens of the reference comparative examples were formed out of the predetermined conditions, the wear resistance and the surface roughness were incompatible with each other.

INDUSTRIAL APPLICABILITY

The hard multilayer film formed body of the present invention has the intermediate layer, having the predetermined structure, which is excellent in its adhesion to the base material and the DLC film which is the surface layer and excellent in its wear resistance. Therefore the hard multilayer film formed body can be preferably utilized as a material to be formed on the sliding surfaces of mechanical parts such as bearings and the surfaces of dies demanded to have excellent peel resistance and wear resistance.

EXPLANATION OF REFERENCE SYMBOLS AND NUMERALS

1: hard multilayer film formed body
2: base material
3: intermediate layer
3a: Intermediate third layer (layer composed mainly of W and C)
3b: Intermediate second layer (layer composed mainly of W)
3c: Intermediate first layer (layer composed mainly of Cr)
4: stress relaxation layer
5: surface layer (film composed mainly of DLC)
6: specimen
7: mating material
8: arm portion
9: load
10: load cell
11: bias supply
12: base material 13: film (layer)
14a: inner magnet
14b: outer magnet
15: target
16: magnetic field line
16a: magnetic field line reached base material
17: Ar ion
18: ionized target
19: high-density plasma
20: AIP evaporation source material
21: disk
22: base material
23, 24: sputter evaporation source material (target)
31: hard multilayer film formed body
32: base material
33: intermediate layer
33a: Intermediate first layer
33b: Intermediate second layer
34: surface layer

The invention claimed is:

1. A hard multilayer film formed body consisting of a multilayer film formed on a surface of a base material, wherein said multilayer film comprises (1) a film, composed mainly of diamond-like carbon, which is formed as a surface layer of said multilayer film, (2) an intermediate layer, composed mainly of a metallic material, which is formed between said surface layer and said base material, and (3) a stress relaxation layer, composed mainly of carbon, which is formed between said intermediate layer and said surface layer; and said stress relaxation layer being a graded layer whose hardness increases continuously or stepwise from a side of said intermediate layer toward a side of said surface layer; and said intermediate layer has either a two-layer structure consisting of a first layer, adjacent to said base material, which is composed mainly of tungsten; and a second layer, adjacent to said first layer at one side thereof and adjacent to said stress relaxation layer at the other side thereof, which is composed mainly of carbon and tungsten or a three-layer structure consisting of a first layer, adjacent to said base material, which is composed mainly of chrome; a second layer, adjacent to said first layer, which is composed mainly of tungsten; and a third layer, adjacent to said second layer at one side thereof and adjacent to said stress relaxation layer at the other side thereof, which is composed mainly of carbon and tungsten, wherein said hard multilayer film formed body is produced by a production method comprising the steps of:
forming said intermediate layer on said base material;
forming said stress relaxation layer on said intermediate layer; and
forming said surface layer on said stress relaxation layer,
wherein said surface layer-forming step is a step at which an unbalanced magnetron sputtering method is used to form a film composed mainly of diamond-like carbon by using a graphite target as a carbon supply source, and said stress relaxation layer-forming step is a step at which said, unbalanced magnetron sputtering method is used to form said stress relaxation layer by using said graphite target and continuously or stepwise raising a bias voltage,
wherein in said surface-layer forming step, as a carbon supply source, only said graphite target is used, and hydrocarbon gas is not used,
wherein in said surface layer-forming step, said film is formed by applying said bias voltage at not less than 250V to said base material.

2. The hard multilayer film formed body according to claim 1, wherein a total thickness of said multilayer is 0.5 to 3.0 μm.

3. The hard multilayer film formed body according to claim 1, which has adhesion to such an extent that peeling does not occur on a periphery of an impression generated when a diamond indenter is stricken there into at a load of 150 kg by a Rockwell hardness tester.

4. The hard multilayer film formed body according to claim 1, wherein said base material consists of a cemented carbide material or a ferrous material.

5. A method for producing a hard multilayer film formed body according to claim 1, comprising the steps of:
forming said intermediate layer on said base material;
forming said stress relaxation layer on said intermediate layer; and
forming said surface layer on said stress relaxation layer, wherein said surface layer-forming step is a step at which an unbalanced magnetron sputtering method is used to form a film composed mainly of diamond-like carbon by using a graphite target as a carbon supply source, and said stress relaxation layer-forming step is a step at which said unbalanced magnetron sputtering method is used to form said stress relaxation layer by using said graphite target and continuously or stepwise raising a bias voltage,
wherein in said surface-layer forming step, as a carbon supply source, only said graphite target is used, and hydrocarbon gas is not used,
wherein in said surface layer-forming step, said film is formed by applying said bias voltage at not less than 250V to said base material.

6. The method for producing a hard multilayer film formed body according to claim 5, wherein at said stress relaxation layer-forming step, a step width in raising said bias voltage stepwise is set to not more than 50V.

7. The method for producing a hard multilayer film formed body according to claim 5, wherein at said intermediate layer-forming step, said intermediate layer is formed by using a metallic material containing at least chrome or tungsten.

8. The method for producing a hard multilayer film formed body according to claim 5, wherein in said unbalanced magnetron sputtering method, argon gas is used as a sputtering gas.

* * * * *